US007236412B2

(12) United States Patent
Pröll et al.

(10) Patent No.: US 7,236,412 B2
(45) Date of Patent: Jun. 26, 2007

(54) INTEGRATED SEMICONDUCTOR MEMORY WITH REDUNDANT MEMORY CELLS REPLACEABLE FOR EITHER TRUE OR COMPLEMENTARY DEFECTIVE MEMORY CELLS

(75) Inventors: Manfred Pröll, Dorfen (DE); Johann Pfeiffer, Ottobrunn (DE); Stephan Schröder, München (DE); Arndt Gruber, München (DE); Georg Erhard Eggers, München (DE)

(73) Assignee: Infineon Technologies AG, Munich (DE)

( * ) Notice: Subject to any disclaimer, the term of this patent is extended or adjusted under 35 U.S.C. 154(b) by 128 days.

(21) Appl. No.: 11/053,659

(22) Filed: Feb. 9, 2005

(65) Prior Publication Data

US 2005/0174863 A1 Aug. 11, 2005

(30) Foreign Application Priority Data

Feb. 9, 2004 (DE) ...................... 10 2004 006 288

(51) Int. Cl.
*G11C 29/00* (2006.01)
(52) U.S. Cl. ............ 365/200; 365/189.05; 365/189.07; 365/190
(58) Field of Classification Search ........... 365/185.23, 365/149, 189.01, 189.05, 189.07, 190, 200, 365/207, 189.05 X, 189.07 X, 190 X, 200 O
See application file for complete search history.

(56) References Cited

U.S. PATENT DOCUMENTS

| 5,218,572 | A | * | 6/1993 | Lee et al. ................... 365/200 |
| 5,555,212 | A | * | 9/1996 | Toshiaki et al. ............ 365/200 |
| 5,963,489 | A | * | 10/1999 | Kirihata et al. ............. 365/200 |
| 6,292,383 | B1 | | 9/2001 | Worley |
| 6,608,783 | B2 | * | 8/2003 | Frankowsky et al. ....... 365/190 |
| 2004/0001375 | A1 | | 1/2004 | Beer |

* cited by examiner

*Primary Examiner*—VanThu Nguyen
(74) *Attorney, Agent, or Firm*—Edell, Shapiro & Finnan, LLC

(57) ABSTRACT

An integrated semiconductor memory including memory cells which can be driven via first and second word lines and can be replaced by redundant memory cells. In the first memory cell type, data can be stored corresponding to the data present at a data input terminal. In the memory cells of a second memory cell type, data can be stored inverted with respect to data present at the data input terminal. The integrated semiconductor memory includes a circuit for data inversion, wherein the data are written to a redundant memory cell, inverted with respect to the data present at the data input terminal if the defective memory cell and the redundant memory cell replacing it are situated in different word line strips of a bit line twist, and if the defective memory cell and the redundant memory cell replacing it are associated with different memory cell types.

40 Claims, 8 Drawing Sheets

INTEGRATED SEMICONDUCTOR MEMORY WITH REDUNDANT MEMORY CELLS REPLACEABLE FOR EITHER TRUE OR COMPLEMENTARY DEFECTIVE MEMORY CELLS

CROSS REFERENCE TO RELATED APPLICATIONS

This application claims priority under 35 U.S.C. §119 to German Application No. DE 10 2004 006 288.9, filed on Feb. 9, 2004, and titled "Integrated Semiconductor Memory Having Redundant Memory Cells," the entire contents of which are hereby incorporated by reference.

FIELD OF THE INVENTION

The invention relates to an integrated semiconductor memory having redundant memory cells and a method for testing and operating the integrated semiconductor memory.

BACKGROUND

In an integrated semiconductor memory such as a DRAM (Dynamic Random Access Memory) semiconductor memory, the memory cells are arranged in a matrix-type memory cell array. The matrix-type configuration of the memory cell array results from the essentially vertical word lines and horizontal bit lines. An individual DRAM memory cell comprises a selection transistor, where the controllable path is connected to the first electrode of a storage capacitor. The second electrode of the storage capacitor is connected to a reference potential. A control terminal of the selection transistor is connected to one of the word lines. The controllable path of the selection transistor is connected to one of the bit lines. Thus, each crossover point between a word line and a bit line represents the location of a memory cell. In order to read out cell information stored in the memory cell, the selection transistor is switched into the on state by applying a corresponding voltage potential to the word line. The charge stored on the storage capacitor flows via the controllable path of the selection transistor to the bit line and alters the potential thereof. In order to assess the cell information, sense amplifiers are employed, designed as differential amplifiers. The sense amplifiers are connected to the end of the bit line. Area optimization of the sense amplifiers presupposes that half of the data applied to the chip, the so-called logical data, are stored within the memory cell with inverse polarity. In other words, the logical data applied to a data input terminal of the integrated semiconductor memory with a high voltage level, e.g., the logic state one, are stored in the storage capacitor of the associated memory cell with a low electrical charge level, e.g., logic state zero. Equivalently, logical data which are applied to the data input terminal with a low voltage level, e.g., logic state zero, will be stored in the storage capacitor of a memory cell with a high electrical charge, e.g., logic state one. The electrical charge stored in the memory cell represents the physical cell information. In the case of approximately half of the memory cells, the physical cell information items, the so-called physical data, do not correspond to the logical data applied to the data input terminal. Such memory cells are referred to as complement cells. Alternately, the other half of the memory cells or true cells, the physical data corresponds to the logical data applied to the data input terminal.

FIG. 1 shows a detail from a memory cell array. The vertically running lines form the word lines and the horizontally running lines represent the bit lines. A memory cell is arranged at the crossover point between a word and bit line. The memory cells designated by SZ1 represent true cells, whereas the memory cells designated by SZ2 are designed as complement cells.

For the purpose of area optimization, the sense amplifiers are arranged in a first strip SF1 and a second strip SF2. The first sense amplifiers SAbc1, SAbc2 located in the first strip SF1 are connected to a first secondary sense amplifier SSA1. The second sense amplifiers SAa1 and SAa2 and respectively SAd1 and SAd2 located in the second strip SF2 are connected to a second secondary sense amplifier SSA2. Between the first and second sense amplifier strips, the bit lines BL are arranged in the form of a bit line twist. FIG. 1 illustrates a first bit line twist between the second sense amplifiers SAa and the first sense amplifiers SAbc and a second bit line twist between the first sense amplifiers SAbc and the second sense amplifiers SAd. Within the first bit line twist and the second bit line twist, the first and second word lines WL1 and WL2 run in a word line strip SFb and SFd, respectively, and a word line strip SFa and SFc, respectively. In the case of the bit line twist illustrated, the bit lines do not run parallel between the first and second sense amplifiers, but rather are offset with respect to one another in sections. The arrangement of the bit lines in the form of a bit line twist reduces interfering coupling influences between the individual bit lines.

The memory cells situated at each crossover point between a word and bit line can be addressed by a plurality of address bits. In the case of the example shown in FIG. 1, the address bits X0, . . . , X10 are used for addressing a memory cell Z, of which address bits, the address bits X0, X1, X9 and X10 are illustrated for the sake of better clarity. In FIG. 1, it is possible to select for example memory cells, via the address bits X0 and X1, which can be driven by the word lines N0, N1, N2 and N3 within the word line strips SFb and SFd and respectively memory cells which can be driven via the word lines R0, R1, R2 and R3 within the word line strips SFa and SFc. The address bits X9 and X10 select one of the four word lines strips SFa, SFb, SFc and SFd. In this case, the word lines designated by R in the word line strip SFa and SFc drive redundant memory cells, whereas the word lines designated by N in the word line strip SFb and SFd drive regular memory cells. If a regular memory cell has been identified as defective during the production process, then the defective memory cell is generally replaced by a redundant memory cell. The repair of defective memory cells is limited by the number of redundant memory cells present, which make up approximately 1% to 2% of all the memory cells of a memory cell array. With continued reference to FIG. 1, the process replacing defective memory cells with redundant memory cells is detailed below.

If, for example, a short circuit between two word lines has arisen during the production process, then all the memory cells which are driven by these two word lines can be replaced by redundant memory cells situated on defect-free word lines. In order to be able to efficiently repair short circuits between word lines, the word lines for driving the redundant memory cells are typically arranged in quadruples. If, for example, a short circuit occurs between the regular word line N3 and N2 in the word line strip SFd, then the memory cells which are driven via the word lines N0, . . . , N3 in the word line strip SFd are replaced by redundant memory cells which are driven via the redundant word lines R0, . . . , R3 in the word line strip SFc. Thus, regular defective memory cells of the word line strip SFd of the second bit line twist are replaced by redundant memory cells in the word line strip SFc. If memory cells of one word line strip are replaced by redundant memory cells of another word line strip within the same bit line twist, a so-called topologically incorrect word line repair results. In the case of the topologically incorrect word line repair, the assignment of the address bits X0 and X1 identifying the word line of repaired memory cells of a defective word line to redundant memory cells of a redundant word line is preserved. By way of example, the two memory cells Z3 are driven by the sense amplifier SAd1 and which are driven via the short-circuited regular word lines N1 and N2. The two memory cells of Z3 are replaced by the two redundant memory cells Z3' which are driven via the defect-free redundant word lines R1 and R2. As can be seen from FIG. 1, the defective true memory cells Z3 are replaced by the redundant complement memory cells Z3'. Equivalently, the two memory cells Z4 which are driven by the sense amplifier SAd1 and which are driven via the word lines N0 and N3 are replaced by the two redundant memory cells Z4' which are driven via the redundant word line R0 and R3. The defective complement memory cells Z4 are thus replaced by the redundant true memory cells Z4'.

The replacement of defective memory cells by redundant memory cells or the replacement of defective word line quadruples by redundant word line quadruples is generally effected during the production process of an integrated semiconductor memory at the wafer level, in the so-called front end of a production line. At the end of the production process, the finished integrated semiconductor memory chips are once again finally tested for functionality in the so-called back end of a production line.

The procedure, for example of a so-called retention test, will now be explained with reference to FIG. 2. A retention test involves testing whether the memory cells retain cell information in the form of a charge stored on the storage capacitor of the memory cell over a relatively long period of time, or whether the storage capacitor is discharged for example via a leakage path. At the beginning of such a retention test, an information item is read into the memory cell to be tested. After a specific retention time T, the information item is read out again from the memory cell in order to test whether the charge has been maintained on the storage capacitor.

FIGS. 2A-2F show a data input and data output terminal DIO for reading data in and out and an amplifier V connected to a memory cell of the memory cell type SZ1 or SZ2. The memory cell is illustrated in a greatly simplified manner, and contains a storage capacitor SC, the first electrode of which is connected to the amplifier V, and at the same time, to a ground reference terminal M, via a leakage path L. The second electrode is connected to the ground reference terminal M. The memory cells of the memory cell type SZ1 are true cells, whereas the memory cells of the memory cell type SZ2 represent complement cells.

FIGS. 2A and 2B show two defective true memory cells with a leakage path L. At the beginning of the retention test, a 1 information item, that is to say a high charge level, is applied to the data input terminal DIO and stored on the storage capacitor SC via the amplifier V. FIG. 2B shows the state of the defective true memory cell after the retention time T has elapsed. The storage capacitor has been completely discharged to ground via the leakage path. A 0 information item arises at the data output terminal DIO. The memory cell of the memory cell type SZ2 can be unambiguously detected as defective by this test.

FIGS. 2C and 2D show a defective complement memory cell with a leakage path L. At the beginning of the retention test, a 1 information item, that is to say a high charge level, is applied to the data input terminal DIO and stored on the storage capacitor SC in inverted fashion, in other words with a low charge level, via the amplifier V and a bidirectional inverter INV. FIG. 2D shows the state of the defective complement memory cell after the retention time T has elapsed. The storage capacitor has been completely discharged to ground via the leakage path L. The leakage path L remains undiscovered during this test for a complement memory cell since the bidirectional inverter inverts the low charge level of the storage capacitor again, so that the 1 information item that was stored in the defective complement memory cell at the beginning of the retention test appears again at the data output terminal DIO after the retention time T has elapsed.

FIGS. 2E and 2F show a successful retention test for testing the same complement memory cell. At the beginning of the retention test, a 0 information item, e.g., a low charge level, is applied to the data input terminal DIO and stored in inverted fashion, that is to say with a high charge level, via the amplifier V and the bidirectional inverter INV. FIG. 2F shows the state of the defective complement memory cell after the retention time T has elapsed. The storage capacitor, which was charged with a high charge level via the inverter at the beginning of the retention test, has been completely discharged to ground after the retention time T has elapsed. At the data output terminal DIO, the bidirectional inverter and the amplifier V generate a 1 information item corresponding to a high charge level. A 1 information item thus occurs at the data output terminal at the end of the retention test, whereas a 0 information item was stored at the beginning of the retention test. The defective complement memory cell can be unambiguously detected as defective by means of this test.

Complement memory cells, during a retention test, can be tested with a 0 information item at the data input and data output terminal, while true memory cells can be tested with a 1 information item at the data input and data output terminal. If a defective true memory cell has been replaced by a redundant complement memory cell in the front end during a topologically incorrect word line repair, then test data for testing this repaired memory cell should be applied to the data input and data output terminal in inverted fashion in the back end of the production line. Otherwise, defective memory cells remain undiscovered.

During relatively long retention tests, the memory cells have been written to with one data topology, for example a 1 or 0 information item, in order to save test time. On the basis of the evaluation of such functional tests, it is known that there is a potential risk of undiscovered defective memory cells on at least 2000 memory cells per topologically incorrect word line repair for approximately 1% of the repairable semiconductor memory chips. This risk is currently accepted for particularly long functional tests, such as special retention tests, for example. For shorter tests, attempts are made to close this test gap by repeating the test with inverted data. However, this generally results in the test time being doubled.

SUMMARY OF THE INVENTION

The present invention specifies integrated semiconductor memory having redundant memory cells wherein topologically incorrectly repaired memory cells can be reliably tested and operated. Additionally, the present invention specifies a method for testing and a method for operating an integrated semiconductor memory having redundant memory cells which enable topologically incorrectly repaired memory cells to be reliably tested and operated.

An integrated semiconductor memory including redundant memory cells, comprising a memory cell array with memory cells of a first memory cell type and a second memory cell type, in which, the memory cells of the first memory cell type can store data corresponding to the data present at a data input terminal. The memory cells of the second memory cell type can to store data inverted with respect to the data present at the data input terminal. The integrated semiconductor memory includes first word lines and second word lines, the first word lines are arranged within the memory cell array in a first strip, and the second word lines are arranged within the memory cell array in a second strip. The memory cells can be driven via the first and second word lines, wherein a portion of the memory cells are designed as redundant memory cells. A defective memory cell, of one memory cell types such as the first and second memory cell types, can be replaced by one of the redundant memory cells of the same memory cell type, wherein a defective memory cell of one memory cell types of the first and second memory cell types can be replaced by one of the redundant memory cells of the other memory cell type. The integrated semiconductor memory furthermore comprises a circuit for data inversion. The circuit for data inversion is designed such that data are written to the redundant memory cell corresponding to the data present at the data input terminal if the redundant memory cell and the defective memory cell are associated with identical memory cell types. Furthermore, the circuit for data inversion is designed such that data are written to the redundant memory cell inverted with respect to the data present at the data input terminal, if a first condition is met that the defective memory cell can be driven via one of the first word lines and the redundant memory cell can be driven via one of the second word lines, and if a second condition is met that the defective memory cell and the redundant memory cell replacing it are associated with different memory cell types. Moreover, the circuit for data inversion is designed such that data are read out inverted with respect to the data previously written to the redundant memory cell, if a third condition is met that the defective memory cell can be driven via one of the first word lines and the redundant memory cell can be driven via one of the second word lines, and if a fourth condition is met that the defective memory cell and the redundant memory cell replacing it are associated with different memory cell types.

In one development, the integrated semiconductor memory comprises a first control unit including a first output terminal for generating a first control system, and a first input terminal for applying an address of one of the memory cells of the memory cell array, and a second input terminal for applying an address of the defective memory cell. It furthermore comprises a second control unit for generating a control signal for data inversion including a first input terminal for applying the first control signal. The circuit for data inversion comprises a control terminal. The second control unit is connected, on the input side, to the first output terminal of the first control unit and, on the output side, to the control terminal of the circuit for data inversion. The control signal for data inversion can be fed to the control terminal of the circuit for data inversion. The first control unit is designed such that it generates the first control signal if the applied address of one of the memory cells matches the address of the defective memory cell and the defective memory cell can be driven via one of the first word lines and the redundant memory cell replacing it can be driven via one of the second word lines. The second control unit is designed such that it generates the control signal for data inversion if the first control signal is fed to it on the input side and the defective memory cell and the redundant memory cell replacing it are associated with different memory cell types. The circuit for data inversion is designed such that, in the event of a write access, data are written to the redundant memory cell inverted with respect to the data present at the data input terminal if the control signal for data inversion is fed to it on the input side. The circuit for data inversion is designed such that, in the event of a read access, data are read out inverted with respect to the data previously written to the redundant memory cell if the control signal for data inversion is fed to it on the input side.

In one embodiment of the invention, the integrated semiconductor memory comprises an address register having address terminals and a memory unit for storing an address of the defective memory cell that is replaced by the redundant memory cell. The first input terminal of the first control unit is connected to the address register. The second input terminal of the first control unit is connected to the memory unit.

In an additional embodiment, the address of one of the memory cells comprises a first address bit and a second address bit. The first and second address bits of the memory cells are designed such that a first logic level can be generated by a logic combination of the first and second address bits if the memory cell can be driven via one of the first word lines. The first and second address bits of the address of one of the memory cells are designed such that a second logic level can be generated by a logic combination of the first and second address bits if the memory cell can be driven via one of the second word lines.

In another refinement of the invention, the logic combination of the first and second address bits for generating the first and second logic levels is designed as an XOR combination.

In a further design of the invention, the first control unit comprises a comparison circuit for generating a second control signal, a logic gate for generating the first control signal, and a logic circuit for generating a third control signal. The address of the defective memory cell and the address applied to the address terminals of the address register can be fed to the comparison circuit on the input side. The comparison circuit is connected, on the output side, to the second output terminal of the first control unit. The first and second address bits of the defective memory cell can be fed to the logic circuit, The second control signal and the third control signal can be fed to the logic gate on the input side. The logic gate is connected, on the output side, to the first output terminal of the first control unit.

In one development, the comparison circuit is designed such that it generates the second control signal if the address of one of the memory cells that is applied to the address terminals of the address register matches the address of the defective memory cell. The logic circuit is designed such that it generates the third control signal if the defective memory cell can be driven via one of the first word lines and the redundant memory cell replacing it can be driven via one of the second word lines.

In an additional embodiment, the logic gate of the first control unit is designed as an AND gate.

In a further embodiment of the integrated semiconductor memory, the memory unit is designed such that the address of the redundant memory cell that replaces the defective memory cell can be stored in it. Furthermore, the memory unit is designed in such a way as to enable an assignment of the address of the defective memory cell to the address of the redundant memory cell.

In another design, the memory unit for storing the address of the defective memory cell is designed as a look-up table for assigning the address of the defective memory cell to the address of the redundant memory cell.

In another embodiment, the logic circuit of the first control unit is connected, on the input side, to the second input terminal of the first control unit. The logic circuit of the first control unit comprises a first logic gate and a second logic gate each having an output terminal. The logic circuit of the first control unit comprises an evaluation circuit, which is connected, on the input side, to the output terminals of the first and second logic gates. The first and second address bits of the defective memory cell can be fed to the first logic gate on the input side. The first and second address bits of the redundant memory cell can be fed to the second logic gate of the logic circuit on the input side. The first and second logic gates of the logic circuit are designed such that the first logic gate generates a first logic level on the output side if the first and second address bits of the defective memory cell that are fed to the first logic gate on the input side address a memory cell which can be driven via one of the first word lines. Addtionally, the second logic gate generates a first logic level on the output side if the first and second address bits of the redundant memory cell that are fed to the second logic gate on the input side address a memory cell which can be driven via one of the first word lines. Furthermore, the first and second logic gates of the logic circuit are designed such that the first logic gate generates a second logic level on the output side if the first and second address bits of the defective memory cell that are fed to the first logic gate on the input side address a memory cell which can be driven via one of the second word lines, and that the second logic gate generates a second logic level on the output side if the first and second address bits of the redundant memory cell that are fed to the second logic gate on the input side address a memory cell which can be driven via one of the second word lines. The evaluation circuit of the logic circuit is designed such that it generates the third control signal on the output side if the logic levels of the first and second logic gates of the logic circuit that are fed to it on the input side do not match.

In one refinement, the first and second logic gates of the logic circuit are in each case designed as an XOR gate.

In another embodiment of the integrated semiconductor memory, the redundant memory cell can be driven via one of the second word lines. The memory unit comprises a first partial memory for storing the address of the defective memory cell, and the defective memory cell to be replaced by the redundant memory cell.

In a further design, the logic circuit of the first control unit can be connected to the second input terminal of the first control unit. In this design, the logic circuit comprises a logic gate, to which the first and second address bits of the address of the defective memory cell that is stored in the first partial memory can be fed. The logic gate of the logic circuit is designed such that the third control signal is generated on the output side if the first and second address bits of the defective memory cell that are fed to the logic gate on the input side address a memory cell which can be driven via one of the first word lines.

In one refinement, the logic gate of the logic circuit is designed as an XOR gate.

In one development, the redundant memory cell can be driven via one of the first word lines. The memory unit comprises a second partial memory for storing the address of the defective memory cell, and for the defective memory cell to be replaced by the redundant memory cell.

In a further embodiment, the logic circuit of the first control unit can be connected to the second input terminal of the first control unit. The logic circuit comprises a logic gate, wherein the first and second address bits of the address of the defective memory cell that is stored in the second partial memory can be fed. The logic gate of the logic circuit is designed such that the third control signal is generated on the output side, if the first and second address bits of the defective memory cell that are fed to the logic gate on the input side address a memory cell which can be driven via one of the second word lines.

In another refinement, the logic gate of the logic circuit is designed as an XNOR gate.

In an implementation, the integrated semiconductor memory comprises first sense amplifiers and second sense amplifiers, where the first sense amplifiers are arranged within the memory cell array in a first strip and the second sense amplifiers are arranged within the memory cell array in a second strip. The address of the defective memory cell and the address of the address of a memory cell that is applied to the address terminals of the address register can be fed to the second control unit on the input side. The second control unit comprises a first partial memory for storing the address of a first defective memory cell, and for the first defective memory cell to be driven via one of the first sense amplifiers. The second control unit comprises a second partial memory for storing the address of a second defective memory cell, and for the second defective memory cell to be driven via one of the second sense amplifiers. The second control unit further comprises a comparison circuit for generating the control signal for data inversion. The addresses of the defective memory cells from the memory unit can be fed to the first and second partial memories. The comparison circuit can be designed such that it generates the control signal for data inversion, if the first control signal is fed to it on the input side and the address of a memory cell that is fed to it, via the address, register matches the address of the defective memory cell that is stored in the second partial memory.

In a preferred embodiment, the circuit for data inversion comprises a controllable switch, which can be controlled by means of the control signal for data inversion, and a bidirectional inverter. The controllable switch is designed such that, in the event of driving by the signal for data inversion with a first logic level, it feeds the data fed to it from the data input terminal to the data terminal of the memory cell array via the bidirectional inverter. The controllable switch is designed such that, in the event of driving the signal for data inversion with a second logic level, it feeds the data fed to it from the data input terminal to the data terminal of the memory cell array.

In yet another development of the integrated semiconductor memory according to the invention, the first sense amplifiers are connected to a first secondary sense amplifier. The second sense amplifiers are connected to a second secondary sense amplifier. The data fed at the data terminal of the memory cell array, via the bidirectional inverter of the circuit for data inversion, can be fed to the second secondary sense amplifier via switching.

In still another embodiment of the integrated semiconductor memory, the circuit for data inversion comprises a first controllable switch having a control terminal for applying the control signal for data inversion and a second controllable switch having a control terminal for applying the control signal for data inversion. The memory cell array comprises a first bit line and a first inverse bit line, the first inverse bit line being at an inverse charge level with respect to the first bit line. The memory cell array further comprises a second bit line and a second inverse bit, the second inverse bit line being at an inverse charge level with respect to the second bit line. The second bit line and the second inverse bit line are connected to the input side of the second sense amplifiers. The circuit for data inversion is designed such that, in the event of driving with the control signal for data inversion with a first logic level, the first bit line is connected to the second inverse bit line, via the first controllable switch, and the first inverse bit line is connected to the second bit line, via the second controllable switch.

In one development, the circuit for data inversion comprises a control terminal for applying a control signal for activating the second bit line and the second inverse bit line, a logic AND gate for generating an activation signal, a third controllable switch having a control terminal for applying the activation signal, and a fourth controllable switch having a control terminal for applying the activation signal. The control signal for data inversion negated and the control signal for activating the second bit line and the second inverse bit line can be fed to the AND gate on the input side. The circuit for data inversion is designed such that in the event that the signal is driven for data inversion with a second logic level and the the control signal is applied to activate the second bit line and the second inverse bit line, the first bit line is connected to the second bit line via the third controllable switch and the first inverse bit line is connected to the second inverse bit line via the fourth controllable switch.

In a further embodiment, the first logic level is designed as a logic high state and the second logic level is designed as a logic low state.

In a preferred implementation, the bit lines connected to the first sense amplifiers and second sense amplifiers are arranged in the form of a bit line twist.

The method to provide an integrated semiconductor memory is detailed as follows, according to one of the embodiments described above.

The first control unit generates the first control signal, if an address applied to the address terminals of the integrated semiconductor memory addresses the defective memory cell and the defective memory cell can be driven via one of the first word lines and the redundant memory cell replacing it can be driven via one of the second word lines. The circuit for data inversion writes the data inverted to the redundant memory cell, with respect to the data present at the data input terminal, if the first control unit generates the first control signal and the defective memory cell and the redundant memory cell replacing it are associated with different memory cell types. Subsequently, the data are read out inverted with respect to the data previously written in inverted fashion to the redundant memory cell by the circuit for data inversion.

In a further implementation of the method for testing an integrated semiconductor memory according to the invention, the second control unit generates the control signal for data inversion if the first control unit generates the first control signal and the defective memory cell and the redundant memory cell replacing it are associated with different memory cell types. The data are written to the redundant memory cell inverted with respect to the data present at the data input terminal by the circuit for data inversion if the second control unit generates the control signal for data inversion. Subsequently, the data are read out inverted with respect to the data previously written in inverted fashion in the redundant memory cell by the circuit for data inversion.

In one development of the method for testing an integrated semiconductor memory according to the invention, the address of the defective memory cell is stored in the memory unit.

In another development of the method for testing an integrated semiconductor memory according to the invention, the address of the redundant memory cell replacing the defective memory cell is stored in the memory unit. The comparison circuit compares an address applied to the address terminals with the address of the defective memory cell that is stored in the memory unit. The first control unit generates the second control signal, if the address applied to the address terminals matches the address of the defective memory cell. By a logic combination of the first and address bits, the logic circuit evaluates the first and second address bits of the defective memory cell and the redundant memory cell replacing it. The logic circuit generates the third control signal if the defective memory cell can be driven by one of the first word lines and the redundant memory cell replacing it can be driven by one of the second word lines. The first control unit generates the first control signal if the comparison circuit generates the second control signal and the logic circuit generates the third control signal.

In a further refinement of the method, the address of the defective memory cell is stored in the first partial memory of the memory unit, if the redundant memory cell replacing the defective memory cell can be driven via one of the second word lines. The comparison circuit compares an address applied to the address terminals with the address of the defective memory cell that is stored in the first partial memory of the memory unit. The first control unit generates the second control signal, if the address applied to the address terminals matches the address of the defective memory cell. By a logic combination of the first and second address bits, the logic circuit of the first control unit evaluates the first and second address bits of the defective memory cell. The logic gate of the logic circuit generates the third control signal, if the defective memory cell can be driven by one of the first word lines. The first control unit generates the first control signal if the comparison circuit generates the second control signal and the logic circuit generates the third control signal.

In a further embodiment of the method, the address of the defective memory cell is stored in the second partial memory of the memory unit, if the redundant memory cell replacing the defective memory cell can be driven via one of the first word lines. The comparison circuit compares an address applied to the address terminals with the address of the defective memory cell that is stored in the second partial memory of the memory unit. The first control unit generates the second control signal, if the address applied to the address terminals matches the address of the defective memory cell. By means of a logic combination of the first and second address bits, the logic circuit of the first control unit evaluates the first and second address bits of the defective memory cell. The logic gate of the logic circuit generates the third control signal, if the defective memory cell can be driven by one of the first word lines. The first control unit generates the first control signal, if the comparison circuit generates the second control signal and the logic circuit generates the third control signal.

In a further implementation of the method, the address of the defective memory cell is stored in the first partial memory of the second control unit, if the defective memory cell can be driven via one of the first sense amplifiers. The address of the defective memory cell is stored in the second partial memory of the second control unit, if the defective memory cell can be driven via one of the second sense amplifiers. The circuit for data inversion generates the control signal for data inversion, if the first control unit generates the first control signal and the address applied to the address terminals of the address register matches the address of the defective memory cell that is stored in the second partial memory of the second control unit.

A description is given below of a method for operating an integrated semiconductor memory.

The method provided employs an integrated semiconductor memory according to one of the embodiments described above.

A first control unit generates a first control signal if an address applied to the address terminals of the integrated semiconductor memory addresses the defective memory cell. The defective memory cell can be driven via one of the first word lines and the redundant memory cell replacing it can be driven via one of the second word lines. The circuit for data inversion writes the data inverted with respect to the data present at the data input terminal to the redundant memory cell if the first control unit generates the first control signal and the defective memory cell and the redundant memory cell replacing it are associated with different memory cell types. Subsequently, the data are read out inverted with respect to the data previously written in inverted fashion to the redundant memory cell by the circuit for data inversion if the first control unit generates the first control signal and the defective memory cell and the redundant memory cell replacing it are associated with different memory cell types.

In a further implementation of the method for operating an integrated semiconductor memory according to the invention, the second control unit generates the control signal for data inversion, if the first control unit generates the first control signal and the defective memory cell and the redundant memory cell replacing it are associated with different memory cell types. The data are written to the redundant memory cell inverted with respect to the data present at the data input terminal by the circuit for data inversion if the second control unit generates the control signal for data inversion. Subsequently, the data are read out inverted with respect to the data previously written in inverted fashion in the redundant memory cell by the circuit for data inversion if the second control unit generates the control signal for data inversion.

In one development of the method for operating an integrated semiconductor memory according to the invention, the address of the defective memory cell is stored in the memory unit.

In yet another development of the method, the address of the redundant memory cell replacing the defective memory cell is stored in the memory unit. The comparison circuit compares an address applied to the address terminals with the address of the defective memory cell that is stored in the memory unit. The first control unit generates the second control signal, if the address applied to the address terminals matches the address of the defective memory cell. By using a logic combination of the first and address bits, the logic circuit evaluates the first and second address bits of the defective memory cell and the redundant memory cell replacing it. The logic circuit generates the third control signal if the defective memory cell can be driven by one of the first word lines and the redundant memory cell replacing it can be driven by one of the second word lines. The first control unit generates the first control signal if the comparison circuit generates the first control signal and the logic circuit generates the third control signal.

In a further refinement of the method, the address of the defective memory cell is stored in the first partial memory of the memory unit, if the redundant memory cell replacing the defective memory cell can be driven via one of the second word lines. The comparison circuit compares an address applied to the address terminals with the address of the defective memory cell that is stored in the first partial memory of the memory unit. The first control unit generates the second control signal, if the address applied to the address terminal matches the address of the defective memory cell. By using a logic combination of the first and second address bits, the logic circuit of the first control unit evaluates the first and second address bits of the defective memory cell. The logic gate of the logic circuit generates the third control signal, if the defective memory cell can be driven by one of the first word lines. The first control unit generates the first control signal, if the comparison circuit generates the second control signal and the logic circuit generates the third control signal.

In a further embodiment of the method, the address of the defective memory cell is stored in the second partial memory of the memory unit if the redundant memory cell replacing the defective memory cell can be driven via one of the first word lines. The comparison circuit compares an address applied to the address terminals with the address of the defective memory cell that is stored in the second partial memory of the memory unit. The first control unit generates the second control signal, if the address applied to the address terminal matches the address of the defective memory cell. By using a logic combination of the first and second address bits, the logic circuit of the first control unit evaluates the first and second address bits of the defective memory cell. The logic gate of the logic circuit generates the third control signal if the defective memory cell can be driven by one of the first word lines. The first control unit generates the first control signal, if the comparison circuit generates the second control signal and the logic circuit generates the third control signal.

In yet a further implementation of the method, the address of the defective memory cell is stored in the first partial memory of the second control unit, if the defective memory cell can be driven via one of the first sense amplifiers. The address of the defective memory cell is stored in the second partial memory of the second control unit, if the defective memory cell can be driven via one of the second sense amplifiers. The circuit for data inversion generates the control signal for data inversion, if the first control unit generates the first control signal and the address applied to the address terminals of the address register matches the address of the defective memory cell that is stored in the second partial memory of the second control unit.

The above and still further aspects, features, and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention is explained in more detail below on the basis of the exemplary embodiments illustrated in the figures, in which.

DETAILED DESCRIPTION

Figure 3:
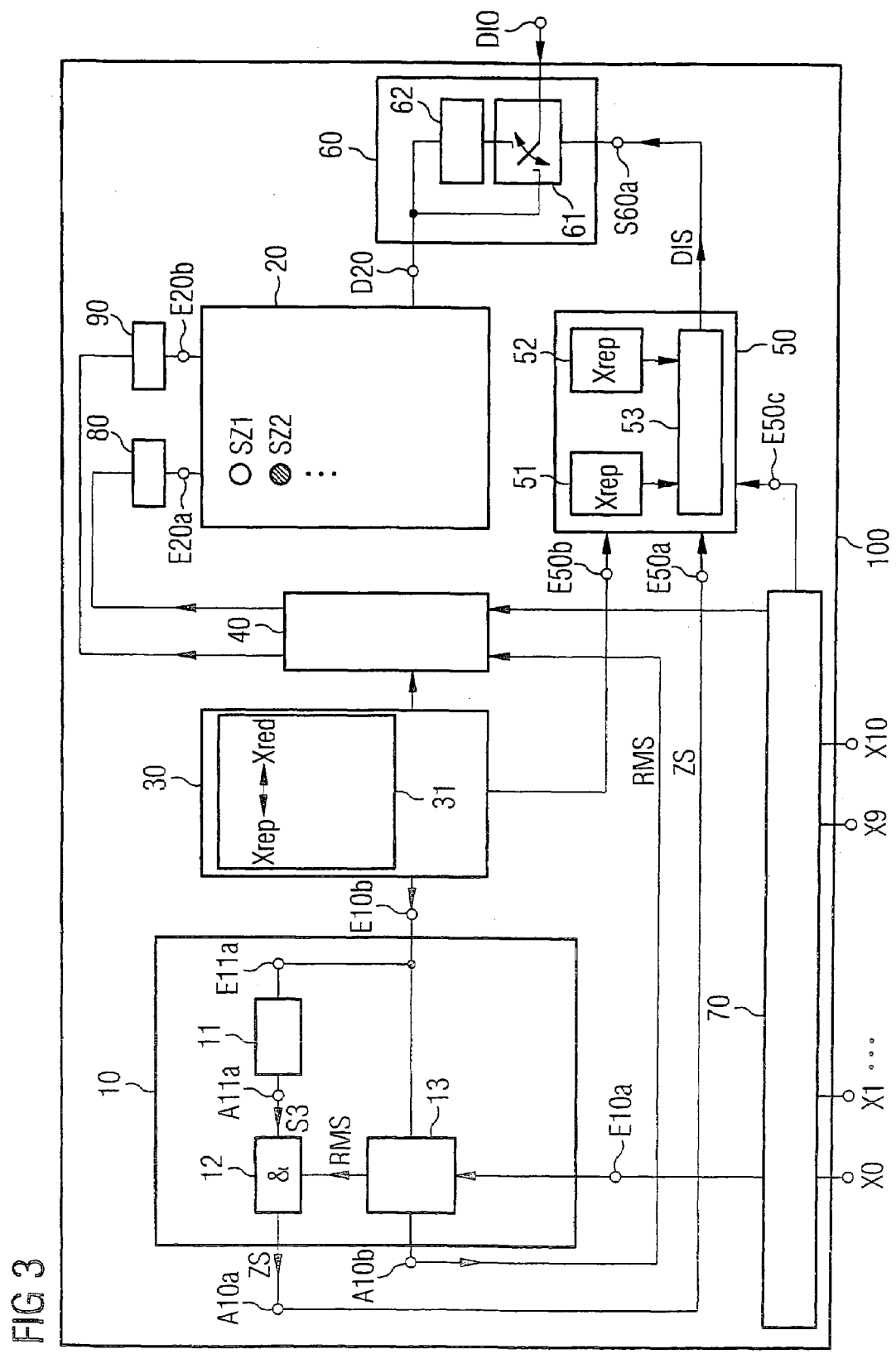
FIG. 3 shows a first embodiment of an integrated semiconductor memory according to the invention.

FIG. 3 shows a first embodiment of an integrated semiconductor memory having redundant memory cells. With reference to FIG. 3, the integrated semiconductor memory 100 comprises a first control unit 10 for controlling the integrated semiconductor memory and a memory cell array 20 having memory cells of a first memory cell type SZ1 and a second memory cell type SZ2. The construction of the memory cell array corresponds to the memory cell array illustrated in FIG. 1. The memory cells of the first memory cell type are designed as complement memory cells, and those of the second memory cell type are designed as true memory cells. The integrated semiconductor memory furthermore comprises a memory unit 30 for storing addresses of memory cells of the integrated semiconductor memory, a decoder circuit 40 for driving first word line drivers 80 and second word line drivers 90. The first and second word line drivers 80 and 90 serve for driving word lines and memory cells of the memory cell array 20 that are connected thereto, the second word line drivers 90 are designed for driving redundant word lines and redundant memory cells connected thereto. The integrated semiconductor memory furthermore comprises a second control unit 50 for generating a control signal DIS for data inversion, a circuit for data inversion 60, and also an address register 70. The integrated semiconductor memory has address terminals X0, X1, . . . , X9, X10 for applying a respective address bit of an address of the memory cell, which are connected to the address register 70. Furthermore, it has a data input and data output terminal DIO connected to the circuit 60 for data inversion.

The memory unit 30, for storing addresses of memory cells of the memory cell array 20, is connected, on the output side, to a second input terminal E10b of the first control unit 10, to a second input terminal E50b of the second control unit 50, and an terminal E10a of the first control unit 10, a third input terminal E50c of the second control unit 50, and the input side of the decoder circuit 40. The first control unit 10 has a first output terminal A10a for generating a first control signal ZS, which is fed to a first input terminal E50a of the second control unit 50, and a second output terminal A10b for generating a second control signal RMS, which is fed to an input side of the decoder circuit 40. The second control unit 50, for generating the control signal for data inversion DIS, feeds the control signal to the control terminal S60a of the circuit 60 for data inversion. The circuit 60 for data inversion is connected, on the input side, to the external terminal DIO for reading data in and out and, on the output side, to the data terminal D20 of the memory cell array 20. On the output side, the decoder circuit 40 is connected via the first word line drivers 80 to a first input terminal E20a of the memory cell array 20 for driving regular memory cells and regular word lines, and is connected via second word line drivers 90 to a second input terminal E20b of the memory cell array 20 for driving redundant memory cells and redundant word lines.

Figure 1:
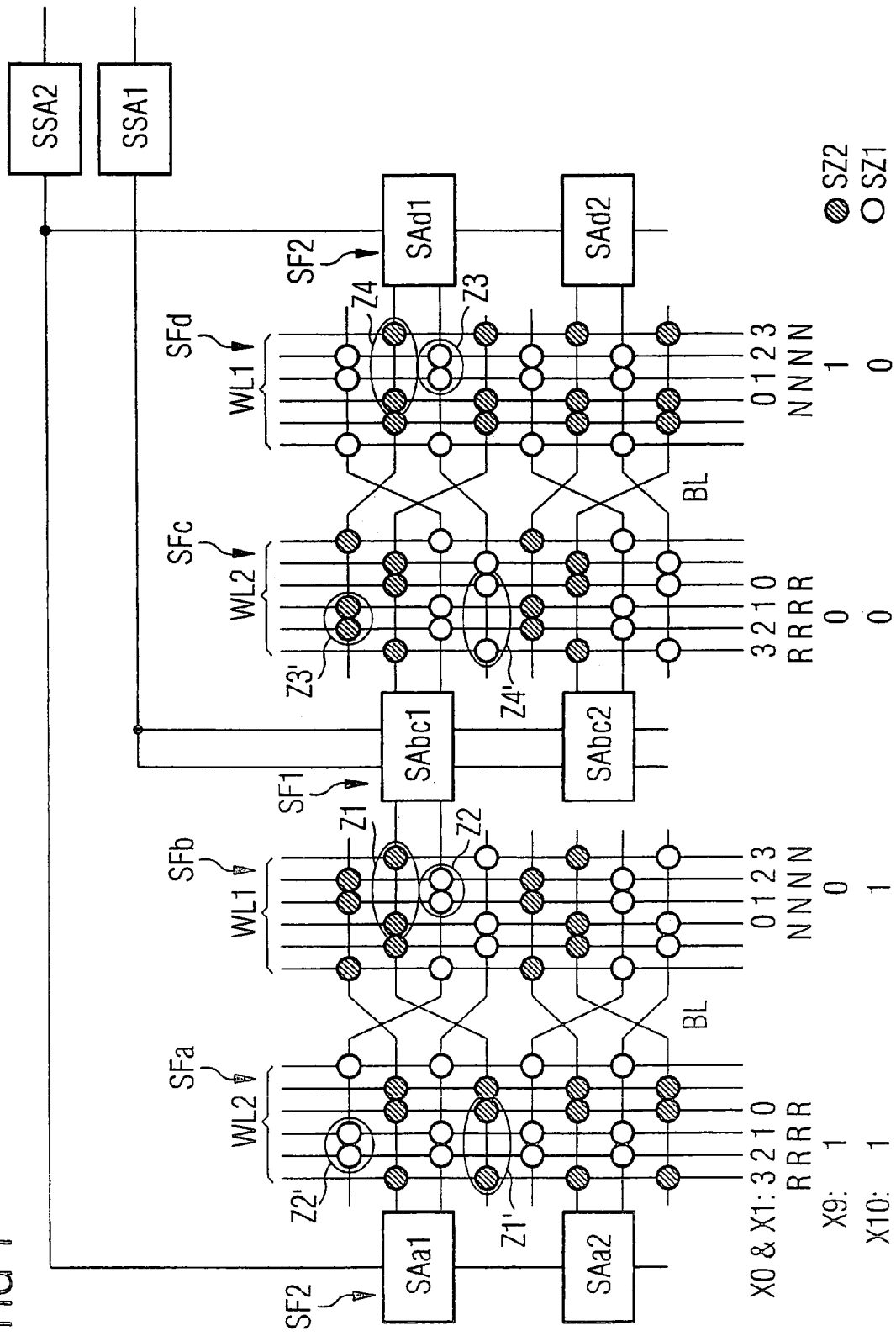
FIG. 1 shows a first embodiment of a memory cell array according to the invention.
Figure 2A:
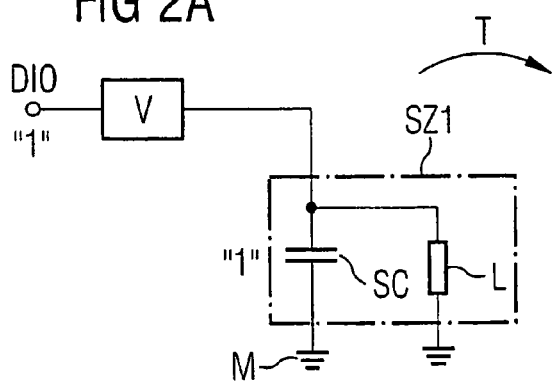
FIGS. 2A-2F show a retention test of a memory cell of a first and second memory cell type.
Figure 2B:
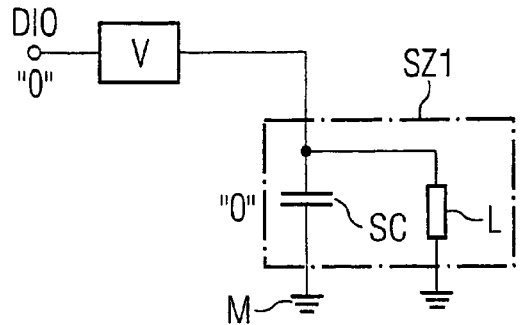
Figure 2C:
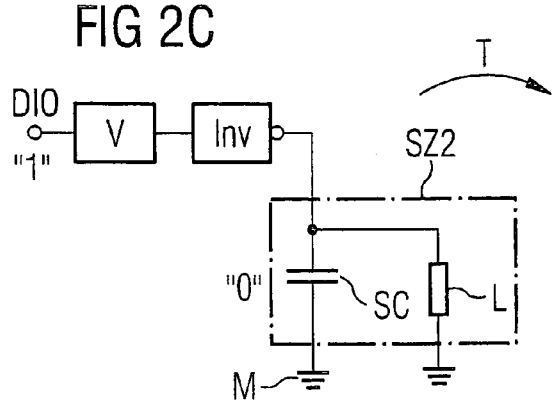
Figure 2D:
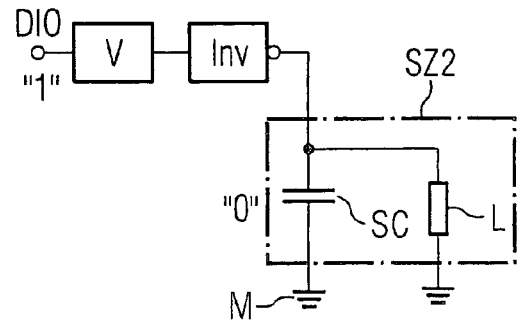
Figure 2E:
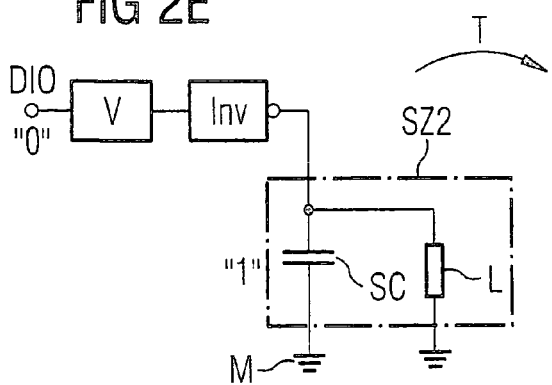
Figure 2F:
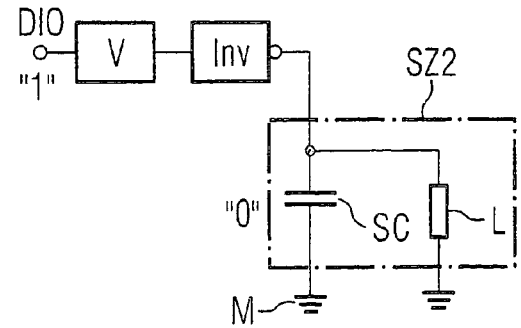

As has already been mentioned in the description of FIG. 1, defective memory cells can be replaced by redundant memory cells during the production process of an integrated semiconductor memory in the front end of a production line. During this repair process, the addresses of the repaired memory cells and the addresses of the redundant memory cells are stored in the memory unit 30 for storing addresses of the integrated semiconductor memory. In this case, each address Xrep of a repaired memory cell is uniquely assigned the address Xred of the redundant memory cell that replaces it. In one possible embodiment, the memory unit 30 is designed as a look-up table 31, which enables the mapping of the addresses Xrep of the repaired memory cells with respect to the address Xred of the redundant memory cell that replaces them. At the same time, the addresses of the repaired memory cells are stored within the second control unit 50 in a first partial memory 51 or a second partial memory 52. The addresses of those repaired memory cells which are driven by the sense amplifies SAbc of the first sense amplifiers strip SF1 are stored in the first partial memory 51. The addresses Xrep of those memory cells which are driven by the sense amplifiers SAa and SAd of the second sense amplifier strip SF2 of the memory cell array 20 are stored in the second partial memory 52. During the testing of a memory cell of the memory cell array 20, the address bits of the memory cell to be tested are applied to the address terminals X0, X1, . . . , X9, X10 and read into the address register 70. The address register 70 feeds this address via the first input terminal E10a of the first control unit 10 to an input side of a comparison circuit 13. At the same time, the addresses Xrep of the repaired memory cells are successively fed to the second input terminal E10b of the first control unit 10. The comparison circuit 13 compares the address of the memory cell to be tested that is applied externally to the address terminals X0, X1, . . . , X9, X10 with the addresses Xrep of the repaired memory cells and generates the second control signal RMS on the output side, and it feeds the second control signal to the second output terminal A10b of the first control unit 10 and to an AND gate 12, if the address applied to the address terminals of the address register matches the address of one of the defective memory cells. The address of the repaired memory cell is furthermore fed via the second input terminal E10b of the first control unit to the input terminal E11a of a logic circuit 11. The logic circuit 11 generates a third control signal S3 at its output terminal A11a, if the repaired memory cell and the redundant memory cell are driven within a bit line twist by different word lines WL1 and WL2 associated with different word line strips SFa and SFb, and respectively SFc and SFd. The third control signal S3 thus identifies a topologically incorrect word line repair. The AND gate 12 generates the first control signal ZS with a logic 1 level on the output side, if the applied address is a repaired memory cell and the defective memory cell was repaired topologically incorrectly. In the case of a topologically correct word line repair, that is to say, if the repaired memory cells and the redundant memory cells are located in the same word line strip of a bit line twist, the AND gate 12 generates the first control signal ZS with a logic 0 level.

The first control signal is fed via the first output terminal A10a of the first control unit 10 to the first input terminal E50a of the second control unit 50. The second control unit 50 comprises a comparison circuit 53 besides the first partial memory 51 for storing the addresses Xrep of the repaired memory cells which are driven by the sense amplifiers SAbc of the first sense amplifier strip SF1, and the second partial memory 52 for storing the addresses Xrep of the repaired memory cells which are driven by the sense amplifiers SAa and SAd of the second sense amplifier strip SF2. The address bits of the externally applied addresses of a memory cell SZ are fed to the comparison circuit 53 on the input side via the address register 70. If the comparison circuit 53 is driven by the logic 1 level of the first control signal ZS on the input side, then comparison circuit 53 compares the address fed to it on the input side by the address register 70 with the addresses Xrep of the repaired memory cells that are stored in the first and second partial memory 51 and 52.

As can be gathered from FIG. 1, defective memory cells Z1 and Z2 in the word line strip SFb which are driven by the sense amplifiers SAbc of the first sense amplifier strip SF1 are replaced by redundant memory cells Z1' and Z2' in the word line strip SFa. In this case, defective true memory cells, e.g., the memory cells Z2, are replaced by redundant true cells, e.g., the memory cells Z2'. Equivalently, defective complement memory cells, e.g., Z1, are replaced by redundant complement memory cells, e.g., Z1'. In this case, a topologically incorrect word line repair does not critically affect the testing of memory cells. In order to test repaired memory cells which are driven by the sense amplifiers of the first sense amplifier strip SF1, data applied to the external data input and data output terminal DIO have to be read in noninverted fashion.

If the external address fed to the second control unit 50 via the third input terminal E50c matches an address of the first partial memory, then the addressed memory cell is a defective memory cell which is driven by one of the sense amplifiers SAbc of the first sense amplifier strip SF1. In this case, the comparison circuit 53 generates the control signal DIS for data inversion with a 0 level.

Conversely, defective memory cells Z3 and Z4, in the word line strip SFd are driven by the sense amplifiers SAd of the second sense amplifier strip SF2, are replaced by redundant memory cells Z3' and Z4' in the word line strip SFc. In this case, defective true memory cells, e.g., Z3, are replaced by redundant complement memory cells, e.g., Z3'. Equivalently, defective complement memory cells, e.g., Z4, are replaced by redundant true memory cells, e.g., Z4'. In order to reliably test repaired memory cells driven by the second sense amplifiers SFd of the second sense amplifier strip SF2, data is applied to the external data input of the data output terminal DIO to be read into the redundant memory cells Z3' and Z4' in inverted fashion.

If the address that is fed externally to the second control unit via the third input terminal E50c matches an address of the second partial memory 52, then the addressed memory cell is a defective memory cell which is driven by one of the sense amplifiers SAa or SAd of the second sense amplifier strip SF2. The comparison circuit 53 is designed such that it generates the control signal DIS for data inversion with a logic 1 level in this case. The second control unit 50 feeds the control signal DIS for data inversion generated on the output side to the control terminal S60a of the circuit 60 for data inversion. If the second control unit generates the control signal for data inversion DIS with a logic 1 level, then the controllable switch 61 is switched such that the data input and data output terminal DIO is connected to the data terminal D20 of the memory cell array 20 via a bidirectional inverter 62. By contrast, if the second control unit generates the control signal DIS for data inversion with a logic 0 level, then the controllable switch 61 is switched such that the external data input and data output terminal DIO is directly connected to the data terminal D20 of the memory cell array 20.

The decoder circuit 40 drives the first regular word line driver 80, if the address applied to the address terminals of the address register 70 does not match the address of a repaired memory cell. In this case, the decoder circuit 40 is not driven with the second control signal RMS by the first control unit. Accordingly, it drives, via the first word line drivers 80, the word line of the memory cell which is addressed by means of the address bits applied to the external address terminals X0, X1, . . . , X9, X10. If the decoder circuit is driven with the second control signal RMS by the first control unit 10, then it drives one of the redundant word lines via the second word line drivers 90. The address of the redundant memory cell to be driven is fed to the decoder circuit 40 by the memory unit 30 in this case.

Figure 4:
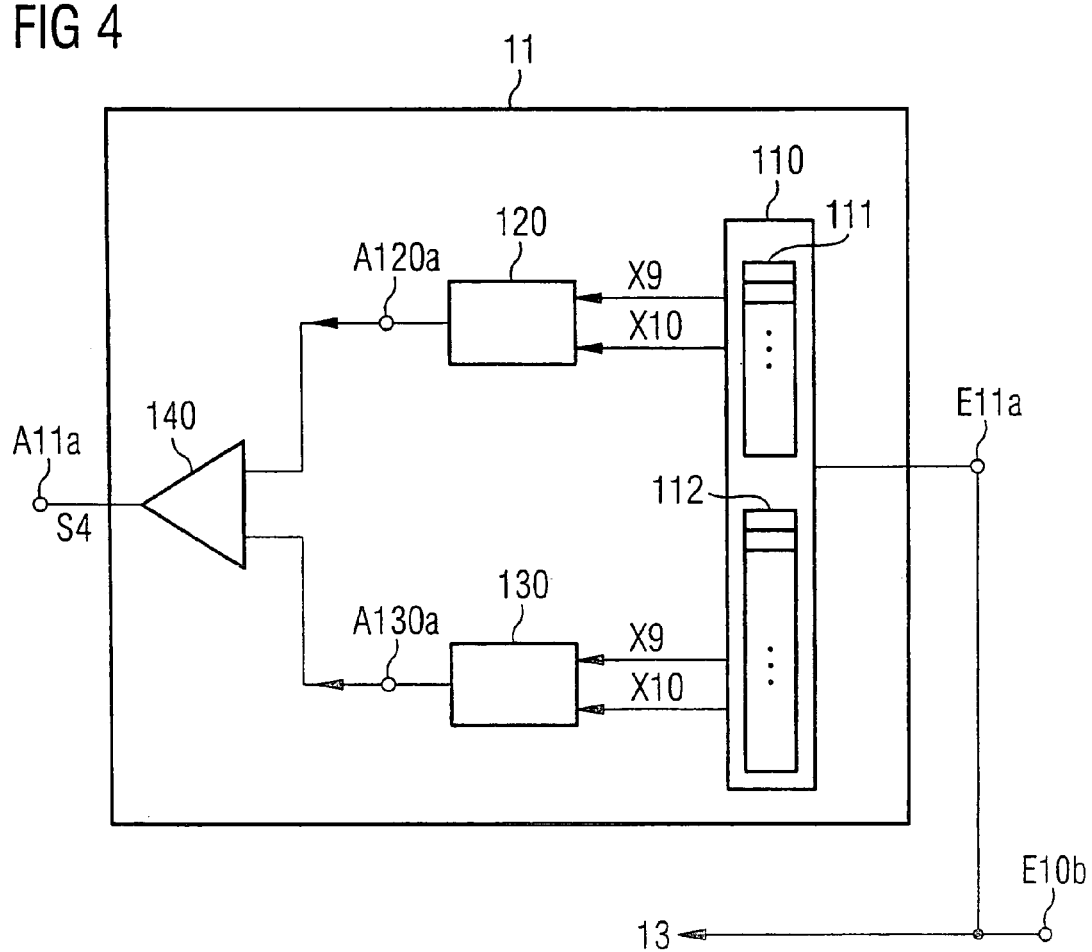
FIG. 4 shows a first embodiment of the logic circuit of an integrated semiconductor memory according to the invention.

FIG. 4 shows an embodiment of the comparison circuit 11 of the first control unit 10 of FIG. 3. The comparison circuit 11 generates the third control signal S3 with a logic 1 level at its output terminal A11a, if a topologically incorrect word line repair has taken place in the memory cell array. In the case of the topologically incorrect word line repair, defective memory cells in the word line strip SFa, SFc and in the word line strip SFb, SFd, respectively, of a bit line twist are replaced by redundant memory cells in the word line strip SFb, SFd and in the word line strip SFa, SFc, respectively, of the corresponding bit line twist. As can be seen in the case of the memory cell array shown in FIG. 1, an XOR combination of the address bits X9 and X10 of the address of a memory cell enables the corresponding memory cell to be uniquely assigned to the first word lines WL1 of the word line strip SFb, SFd and to the second word lines of the word line strip SFa, SFc, respectively. The XOR combination of the address bits X9 and X10 of the address of a memory cell that is driven via one of the first word lines WL1 of a bit line twist produces a logic 1. The XOR combination of the address bits X9 and X10 of the address of a memory cell that is driven by the second lines WL2 produces a logic 0. This property of the memory cell array is utilized in the configuration of the comparison circuit 11 of the first control unit 10. The comparison circuit 11 comprises a register circuit 110 having a first partial register 111 for storing the address bits Xrep of the repaired memory cell and a second partial register 112 for storing the address bits Xred of the redundant memory cell that replaces it, a first logic gate 120, a second logic gate 130 and also an evaluation circuit 140. The register circuit 110 is connected to the input terminal E11a of the comparison circuit 11. The addresses Xrep of the repaired memory cells and the address Xred of the redundant memory cell that replaces the latter are fed to the register circuit 110 via said input terminal. The individual address bits of the repaired memory cells are stored in the first partial register 111 and the address bits of the redundant memory cells are stored in the second partial register 112. The first partial register feeds the address bits X9 and X10 of the repaired memory cell to the first logic gate 120, whereas the second partial register 112 feeds the address bits X9 and X10 of the redundant memory cell to the second logic gate 130. The first and second partial registers are designed as XOR gates. If the repaired memory cell or the redundant memory cell can be driven via one of the first word lines WL1, then the first XOR gate 120 or the second XOR gate 130 generates a logic 1 on the output side. If the repaired memory cell or the redundant memory cell can be driven by one of the second word lines WL2, then the first XOR gate 120 or the second XOR gate 130 generates a logic 0 on the output side. The output side A120a and A130a of the first and second XOR gates 120, 130 are connected to an input side of the evaluation circuit 140. On the output side, the evaluation circuit 140 generates the third control signal S3 with a logic 0 level if the logic signal levels fed to it by the XOR gate 120 and the XOR gate 130 match, or the third control signal S3 with a logic 1 level if the logic signal levels fed to it by the first XOR gate 120 and by the second XOR gate 130 do not match. If the third control signal S3 assumes the logic 0 level, then the repaired memory cell and the redundant memory cell that replaces it are thus located on the same word line strip within a bit line twist. If the third control signal S3 assumes the logic 1 level, then the repaired memory cell and the redundant memory cell that replaces it are located on different word line strips within a bit line twist. The logic signal level of the third control signal S3 thus permits the presence of a topologically incorrect word line repair.

It should be noted that the method of operation of the integrated semiconductor memory illustrated in FIG. 3 and also the embodiment—illustrated in FIG. 4—of the logic circuit of an integrated semiconductor memory designed in this way have been described by way of example on the basis of the embodiment of a memory cell array as illustrated in FIG. 1, but are not restricted to this form of configuration of the memory cell array. In the Figures, redundant word lines and memory cells are situated only in the word line strip SFa and SFc, for reasons of better clarity. In general, redundant word lines and memory cells are also situated in the opposite word line strips of a bit line twist, for example in the word line strip SFb and SFd in FIG. 1.

Figure 5:
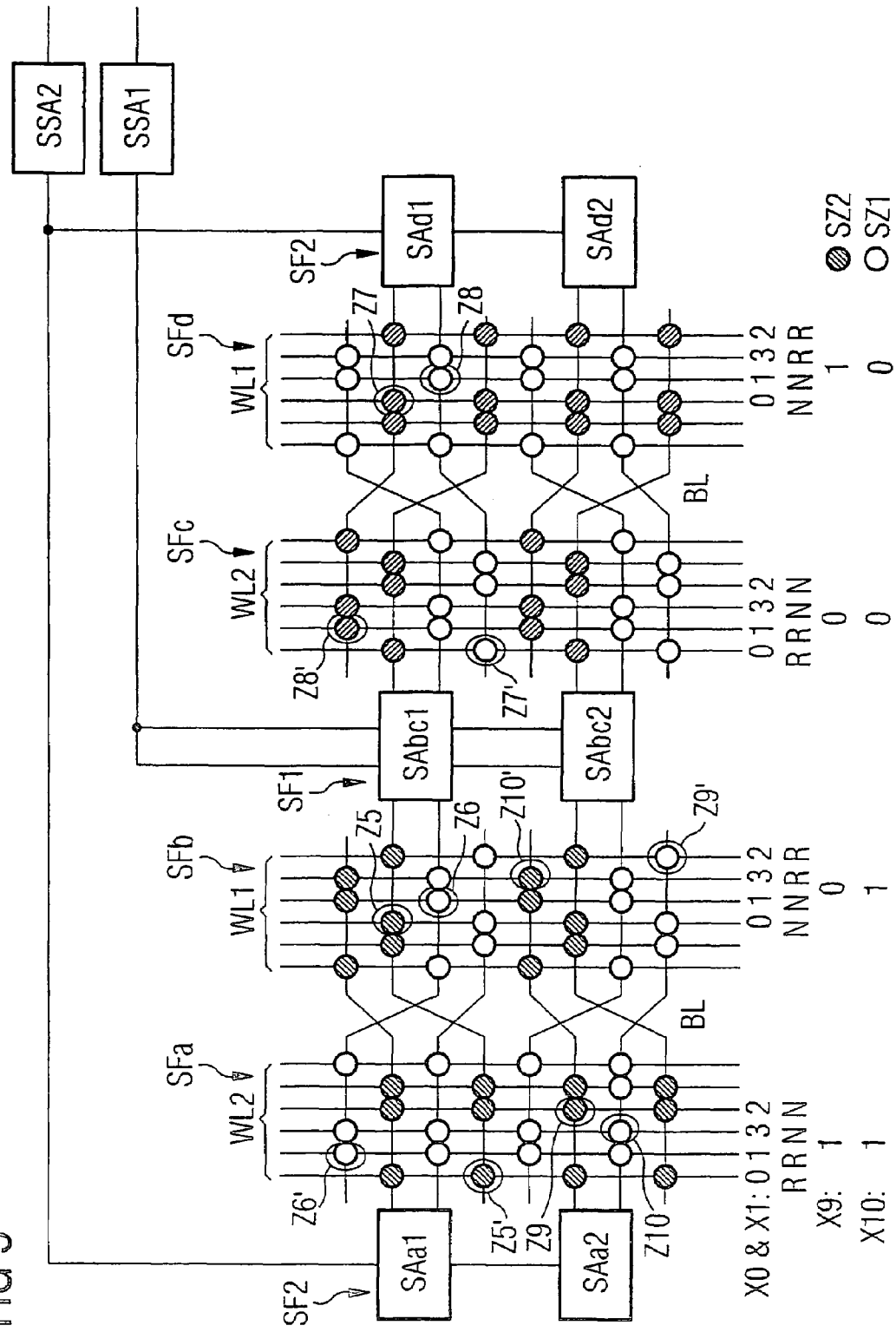
FIG. 5 shows a second embodiment of a memory cell array according to the invention.

FIG. 5 shows a second embodiment of a memory cell array having memory cells of a first memory cell type, such as true cells, and memory cells of a second memory cell type, such as complement cells. The memory cell array comprises a first secondary sense amplifier SSA1 and a second secondary sense amplifier SAA2. The first secondary sense amplifier SSA1 drives the sense amplifiers SAbc1 and SAbc2 located in a first sense amplifier strip SF1. The second secondary sense amplifier SSA2 drives the second sense amplifiers SAa1, SAa2, SAd1 and SAd2 located in a second sense amplifier strip SF2.

A first bit line twist is situated between the sense amplifiers SAbc1, SAbc2 and the sense amplifiers SAa1, SAa2. The memory cells of said first bit line twist are situated in a word line strip SFa and a word line strip SFb, respectively. In the first bit line twist, redundant word lines R0, R1 are situated in the word line strip SFa, whereas the redundant word lines R2 and R3 are situated in the word line strip SFb.

If a short circuit occurs between the regular word lines N0 and N1 in the word line strip SFb, then the two defective word lines are replaced by the redundant word lines R0 and R1 in the word line strip SFa. The complement cell Z5 in the word line strip SFb, which is driven by the first sense amplifier SAbc1 in the first sense amplifier strip SF1, is replaced by the complement cell Z5' in the word line strip SFa, likewise driven by the sense amplifier SFabc1 in the first sense amplifier strip SF1. The true cell Z6 in the word line strip SFb is replaced by the true cell Z6' in the word line strip SFa.

If a short circuit occurs between the regular word lines N2 and N3 in the word line strip SFa, then the two defective word lines N2 and N3 are replaced by the redundant word lines R2 and R3 in the word line strip SFb. The complement cell Z9 in the word line strip SFa, which is driven by the second sense amplifier SAa2 in the second sense amplifier strip SF2, is replaced by the true cell Z9' in the word line strip SFb, which is likewise driven by the second sense amplifier SAa2 of the second sense amplifier strip SF2. The true cell Z10 in the word line strip SFa is replaced by the complement cell Z10' in the word line strip SFb.

A second bit line twist is situated between the first sense amplifiers SAbc1, SAbc2 and the second sense amplifiers SAd1, SAd2. The memory cells of the second bit line twist are situated in a word line strip SFc and SFd, respectively. In the second bit line twist, redundant word lines R0 and R1 are situated in the word line strip SFc, while the redundant word lines R2, R3 are situated in the word line strip SFd. If a short circuit occurs between the regular word lines N0 and N1 in the word line strip SFd, then the two defective word lines N0 and N1 are replaced by the redundant word lines R0 and R1 in the word line strip SFc. The complement cell Z7 in the word line strip SFd, which is driven by the sense amplifier SAd1 in the second sense amplifier strip SF2, is replaced by the true cell Z7' in the word line strip SFc, which is likewise driven by the sense amplifier SAd1. The true memory cell Z8 in the word line strip SFd is replaced by the complement cell Z8' in the word line strip SFc.

The memory cell array of FIG. 5, depicts defective memory cells of one memory cell type which are driven by the first secondary sense amplifier SSA1, or defective memory cells which are driven by the first sense amplifiers SAbc in the first sense amplifier strip SF1. These defective memory cells are replaced by redundant memory cells of the same memory cell type. As further shown in FIG. 5, the memory cells of the word line strip SFa are assigned the address bits X9=1 and X10=1 and the memory cells of the word line strip SFc are assigned the address bits X9=0 and X10=0. The memory cells of the word line strip SFb are assigned the address bits X9=0 and X10=1 and the memory cells of the word line strip SFd are assigned the address bits X9=1 and X10=1. An XOR combination of the two address bits X9 XOR X10 supplies a logic zero for memory cells of the word line strip SFa and SFc and a logic one for memory cells of the word line strip SFb and SFd. The XOR combination of the address bits X9 XOR X10 of a memory cell thus supplies a unique assignment as to whether the memory cell can be driven via one of the second word lines WL2 of the word line strip SFa or SFc or by one of the first word lines WL1 of the word line strip SFb or SFd.

Figure 6:
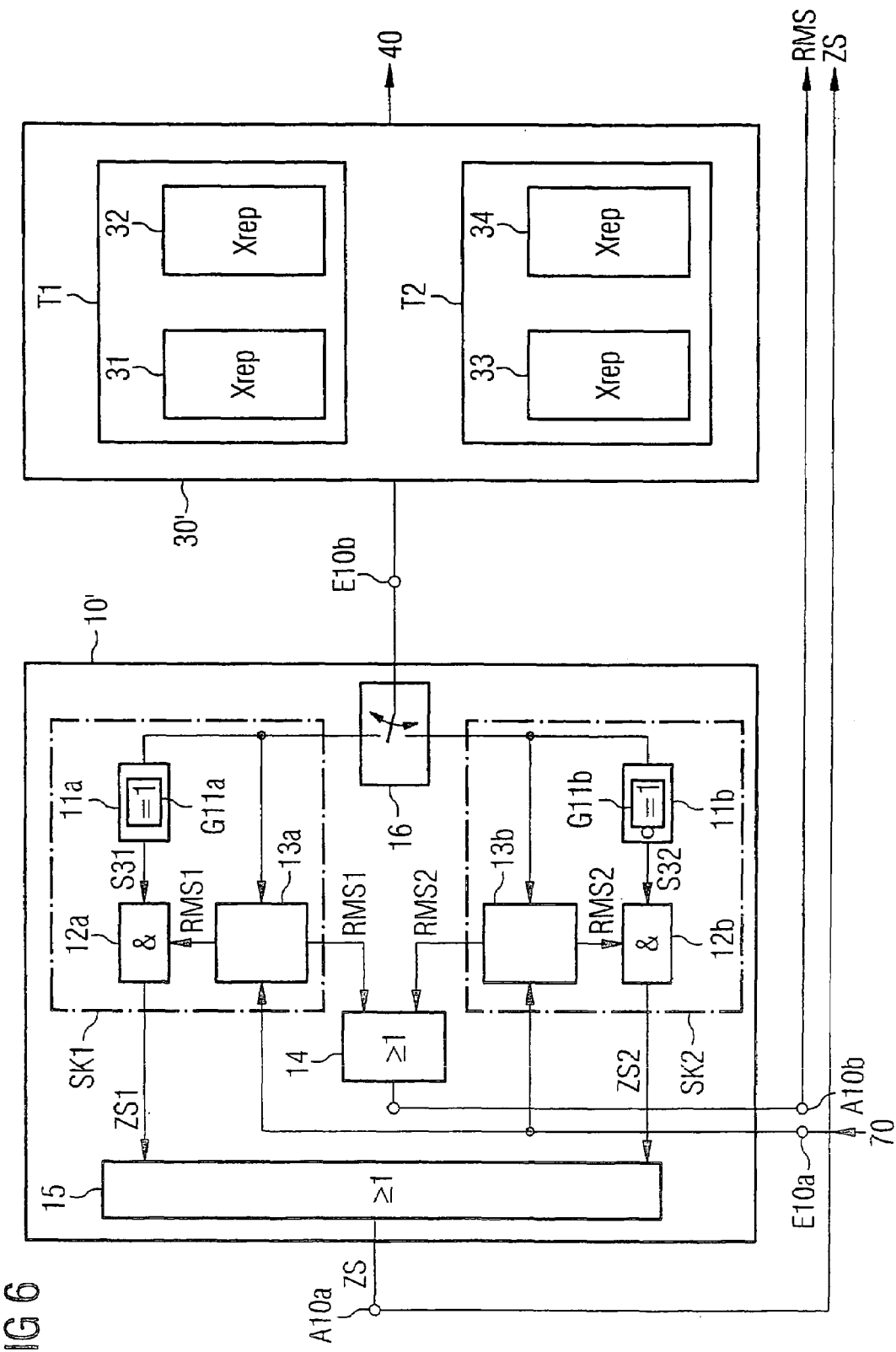
FIG. 6 shows an embodiment of a first control unit and of a memory unit of an integrated semiconductor memory according to the invention.

To ensure the redundant memory cells of the memory cell array illustrated in FIG. 5 are reliably tested and operated correspondingly, the first control unit 10 and the memory unit 30 are modified in comparison with the exemplary embodiment of the integrated semiconductor memory as shown in FIG. 3. FIG. 6 shows the modified first control unit 10' and also the modified memory unit 30'. The modified memory unit 30' contains a first partial memory T1 and a second partial memory T2. The addresses 31, of the repaired memory cells are replaced by redundant memory cells of the redundant word line R0 and the addresses 32 of the repaired memory cells are replaced by redundant memory cells of the redundant word line R1, are stored in the first partial memory T1. The redundant word lines R0 and R1 are associated with the second word lines WL2 in the word line strip SFa and SFc. The XOR combination of the address bits X9 XOR X10 of these memory cells produces a logic 0, as shown in the exemplary embodiment of FIG. 5. The addresses 33, of the repaired memory cells are replaced by redundant memory cells of the word line R2 and the addresses 34 of the repaired memory cells are replaced by redundant memory cells of the redundant word line R3, are stored in the second partial memory T2. These redundant word lines R2 and R3 are associated with the first word lines WL1 in the word line strip SFb and SFd. The XOR combination of the address bits X9 XOR X10 of these memory cells produces a logic 1, as shown in the exemplary embodiment of FIG. 5.

The addresses Xrep of the repaired memory cells of the first partial memory T1 and of the second partial memory T2 are fed to the second input terminal E10b of the first control unit 10'. A changeover switch 16 connected to the second input terminal E10b feeds the addresses of the first partial memory T1 to a first circuit component SK1, whereas it feeds the addresses of the repaired memory cells of the second partial memory T2 to a second circuit component SK2. The first circuit component SK1 comprises a logic circuit 11a, an AND gate 12a and a comparison circuit 13a. The address bits of an externally applied address are fed to the comparison circuit 13a on the input side via the first input terminal E10a connected to the address register 70. The address bits of a repaired memory cell of the first partial memory are likewise fed to the comparison circuit via the changeover switch 16. If the two addresses match, the comparison circuit generates a second control signal RMS1 with a logic one level on the output side and feeds the second control signal RMS1 to the input side of the AND gate 12a and an OR gate 14. The address bits Xrep of a repaired memory cell of the first partial memory are fed to the logic circuit 11a on the input side via the changeover switch 16. The logic circuit 11a carries out an XOR combination of the address bits X9 and X10 of the address Xrep fed to it, via an XOR gate G11a. On the output side, it generates a third control signal S31 with a logic one level if the repaired memory cell is driven by one of the first word lines WL1 of the word line strip SFb or SFd in FIG. 5, or the third control signal S31 with a logic zero level if the repaired memory cell is driven by one of the second word lines WL2 of the word line strip SFa or SFc in FIG. 5. The third control signal is fed to the input side of the AND gate 12a. On the output side, the AND gate 12a generates a first control signal ZS1 with a logic one level, if the externally applied address matches the address of a repaired memory cell and a topologically incorrect word line repair has taken place. In all other cases, the AND gate 12a generates the first control signal ZS1 with a logic zero level on the output side.

The second circuit component SK2 comprises a logic circuit 11b, an AND gate 12b and a comparison circuit 13b. The construction and the method of operation of the second circuit component SK2 essentially corresponds to the construction and the method of operation of the first circuit component SK1. Therefore, the following discussion will focus on the differences. The addresses Xrep of the repaired memory cells of the second partial memory are fed to the second circuit component SK2 on the input side via the changeover switch 16. The comparison circuit 13b generates the second control signal RMS2 on the output side if the address of a memory cell that is applied externally to the address terminals of the address register matches an address Xrep of the second partial memory T2, and feeds the second control signal RMS2 on the output side to the AND gate 12b and the OR gate 14. In contrast to the logic circuit of the first circuit component SK1, the logic circuit 11b is designed as an XNOR gate G11b. This ensures that it generates the third control signal S32 with a logic one level, if the repaired memory cell is driven by one of the second word lines WL2 of the word line strip SFa or SFc, or the third control signal S32 with a logic zero level, if the repaired memory cell is located in the word line strip SFb or SFd. The AND gate 12b generates the first control signal ZS2 with a logic one level on the output side, if the address applied externally to the address terminals of the address register does not match the address of a repaired memory cell and a topologically incorrect word line repair has taken place. In all other cases, the AND gate 12b generates the first control signal ZS2 with a logic zero level on the output side.

The first and second circuit components SK1 and SK2 feed the first control signals ZS1 and ZS2, respectively, generated by them to the input side of an OR gate 15, which, on the output side, is connected to the first output terminal A10a of the first control unit 10'. The OR gate 15 ensures that the first control signal ZS of the first control unit 10' is generated precisely when one of the first and second circuit components SK1 and SK2 has generated one of the first control signals ZS1 and ZS2. The first and second circuit components SK1 and SK2 feed the second control signals RMS1 and RMS2, respectively, generated by them to the input side of an OR gate 14, which, on the output side, is connected to the second output terminal A10b of the first control unit 10'. The OR gate 14 ensures that the second control signal RMS of the first control unit 10' is generated precisely when one of the first and second circuit components SK1 and SK2 has generated one of the second control signals RMS1 and RMS2.

Figure 7:
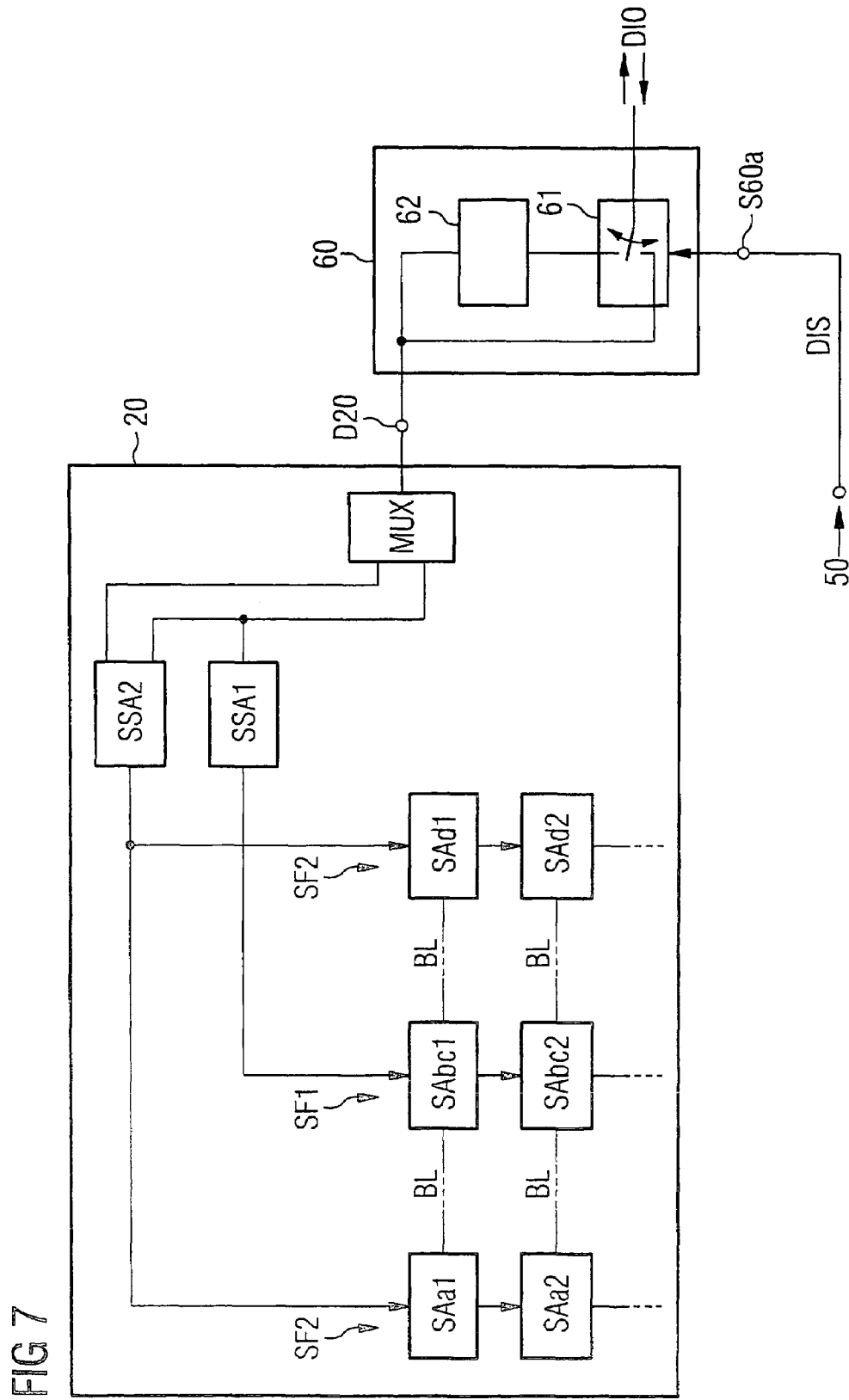
FIG. 7 shows a first embodiment of a circuit for data inversion according to the invention.

FIG. 7 shows a first embodiment of the data inversion of redundant memory cells, in which the data inversion is performed outside the memory cell array. The FIG. 7 shows the circuit for data inversion 60, corresponding to the circuit for data inversion previously described in FIG. 3, and a detail from a configuration of the memory cell array 20. If the control terminal S60a, of the circuit for data inversion 60, is fed with a low level of the control signal DIS for data inversion, the controllable switch 61 is switched such that data applied to the external data input and data output terminal DIO are fed directly to the data terminal D20, of the memory cell array 20. If the second control unit 50 generates the signal for data inversion with a high level and leads it to the control terminal S60a of the circuit for data inversion 60, then the controllable switch 61 is switched such that data applied to the data input and data output terminal are fed to the data terminal D20, via the bidirectional inverter 62. In this case, the data are present in inverted fashion at the data terminal D20.

The memory cell array 20 contains a multiplexer MUX connected to the data terminal D20. On the output side, the multiplexer drives a first secondary sense amplifier SSA1 and a secondary sense amplifier SSA2. The first secondary sense amplifier SSA1 drives first primary sense amplifiers SA1 located in the first sense amplifier strip SF1 of the memory cell array. The second secondary sense amplifier SSA2 drives second primary sense amplifiers SA2 located in the second sense amplifier strip SF2 of the memory cell array. Arranged between the sense amplifier strips of the primary sense amplifier SA1 and SA2 are true and complement memory cells with bit lines BL of a bit line twist, as illustrated in the memory cell array of FIG. 1 or 5. As previously described with reference to the memory cell arrays in FIGS. 1 and 5, the data applied to the data input and data output terminal DIO are stored in inverted fashion in redundant memory cells which are driven by the second secondary sense amplifier SSA2 or by the primary sense amplifiers SAa and SAd, respectively, of the second sense amplifier strip SF2. The data such as have been applied externally to the data input and data output terminal are written to redundant memory cells which are driven by the first secondary sense amplifier SSA1 or by primary sense amplifiers SAbc of the first sense amplifier strip SF1.

Figure 8:
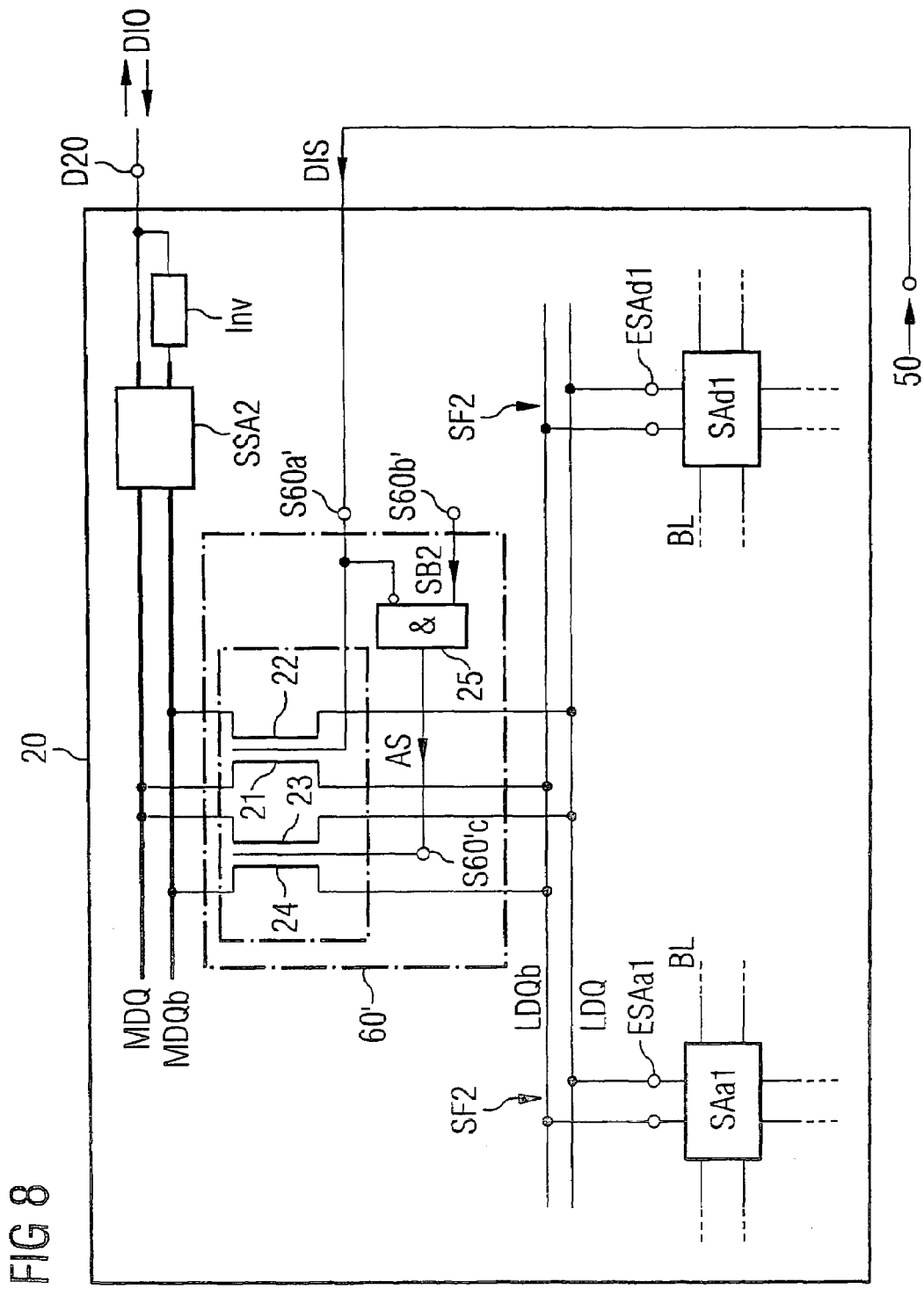
FIG. 8 shows a second embodiment of a circuit for data inversion according to the invention.

FIG. 8 shows a further embodiment of the circuit for data inversion 60', in which the inversion of the data is performed within the memory cell array. Since only data of redundant memory cells are driven by the second secondary sense amplifier SSA2, or are driven by primary sense amplifiers in the second sense amplifier strip SF2, and inverted, only the components connected to the second secondary sense amplifier SSA2 are represented in the case of the memory cell array illustrated here. The data applied externally to the data input and data output terminal DIO are fed to the secondary sense amplifier SSA2 of the memory cell array 20 via the data terminal D20 directly or in a manner inverted by means of the bidirectional inverter INV. On the output side, the secondary sense amplifier SSA2 feeds the data onto the so-called master data line MDQ and the inverted data onto the inverse master data line MDQb. The switching transistors 21 and 22 connect the master data line MDQ to the inverse local data line LDQb, and the inverse master data line MDQb to the local data line LDQ. The switching transistors 23 and 24 connect the master data line MDQ to the so-called local data line LDQ, and the inverse master data line MDQb to the associated inverse local data line LDQb. The local data line LDQ and the inverse local data line LDQb are connected to the primary sense amplifiers SAa1 and SAd1 of the second sense amplifier strip SF2. The primary sense amplifiers drive the true and complement memory cells which are connected to bit lines BL of a bit line twist, as has been illustrated for example on the basis of the embodiments of the memory cell array of FIGS. 1 and 5. The switching transistors 23 and 24 are driven via an AND gate 25. The control signal for data inversion DIS is fed in negated fashion to an input side of the AND gate 25. An activation signal SB2 is likewise fed to the AND gate 25 on the input side. The activation signal SB2 serves as a control signal in order to connect the master data line and the inverse master data line to the local data line and the inverse local data line, respectively, via switching, for example the switching transistors 23 and 24. If the control signal DIS for data inversion from the second control unit 50 is applied to the AND gate 25 with a high level, corresponding to logic one, and the activation signal SB2 is substantially simultaneously fed to the AND gate 25 on the input side, then the AND gate 25 generates a control signal AS with a low level, corresponding to logic zero, on the output side. As a result, the switching transistors 23 and 24 remain turned off, and are designed such that they are the n-conducting type, for example. If the control signal for data inversion DIS from the second control unit 50 is generated with a low level and the activation signal SB2 is additionally applied to the AND gate 25, then the switching transistors 23 and 24 are driven by the control signal AS with a high level. The switching transistors 23 and 24 are thereby turned on, so that the master data line MDQ is connected to the local data line LDQ and the inverse master data line MDQb is connected to the inverse local data line LDQb. No data inversion occurs in this case.

Conversely, the switching transistors 21 and 22, are designed such that they are of the n-conducting type, and are turned on by the high level of the control signal for data inversion DIS, so that the local data line LDQ is connected to the inverse master data line MDQb and the inverse local data line LDQb is connected to the master data line MDQ. As a result, the data are written in inverted fashion to the redundant memory cells connected to the primary sense amplifiers SAa1 and SAd1 of the second sense amplifier strip SF2.

If, in the event of a write access to the integrated semiconductor memory, data has been written to the redundant memory cell inverted with respect to the data applied to the data input and output terminal, then these data also have to be read out in inverted fashion again in the event of a read access. It should be noted that the two circuits 60 and 60', for data inversion, enable the inverted read-out, from the redundant memory cells, in the event of a read access by driving the control signal DIS for data inversion.

Since the changeover of the controllable switch 61 of the first embodiment and also the changeover of the switching transistors 24 and 25 of the second embodiment of data inversion is already accomplished at the point in time when an address is applied to the external address terminals X0, X1, . . . , X9, X10 of the address register 70, the data inversion is non-critical with respect to time for both solutions.

A comparison of the embodiment of data inversion as shown in FIG. 7 with the embodiment shown in FIG. 8 reveals that, in contrast to the circuit 60', the circuit 60 does not require additional switching transistors. Chip area can be saved as a result.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

List of reference symbols:

| | |
|---|---|
| A | Output terminal |
| As | Activation signal |
| BL | Bit line |
| D | Data terminal of the memory cell array |
| DIO | Data input terminal |
| DIS | Control signal for data inversion |
| E | Input terminal |
| G | Gate |
| Inv | Inverter |
| L | Leakage path |
| LDQ | Local data line |
| M | Reference potential terminal |
| MDQ | Master data line |
| MUX | Multiplexer |
| N | Regular word line |
| R | Redundant word line |
| RMS | Second control signal |
| S | Control terminal |
| SA | Sense amplifier |
| SB | Control signal for activating a bit line |
| SC | Storage capacitor |
| SF | Sense amplifier strip |
| SK | Circuit component |
| SSA | Secondary sense amplifier |
| SZ | Memory cell type |
| T | Time period |
| T1, T2 | Partial memory of the memory unit |
| V | Amplifier |
| WL | Word line |

-continued

| List of reference symbols: | |
|---|---|
| X0, ..., X10 | Address bits |
| Xred | Address of the redundant memory cell |
| Xrep | Address of the defective memory cell |
| Z | Defective memory cell |
| Z' | Redundant memory cell |
| ZS | First control signal |
| 10 | First control unit |
| 11 | Logic circuit |
| 12 | AND gate |
| 13 | Comparison circuit |
| 14, 15 | OR gate |
| 16 | Changeover switch |
| 20 | Memory cell array |
| 21, ..., 24 | Switching transistors |
| 25 | AND gate |
| 30 | Memory unit |
| 31, ..., 34 | Address memory of the memory unit |
| 40 | Decoder circuit |
| 50 | Second control unit |
| 60 | Circuit for data inversion |
| 61 | Controllable switch |
| 62 | Bidirectional inverter |
| 70 | Address register |
| 80 | Word line driver of regular word lines |
| 90 | Word line driver of redundant word lines |
| 100 | Integrated semiconductor memory |
| 110 | Register |
| 111, 112 | Partial register of the logic circuit |
| 120, 130 | XOR gate |
| 140 | Evaluation circuit |

What is claimed is:

1. An integrated semiconductor memory including redundant memory cells, comprising:

a memory cell array including memory cells of a first memory cell type and a second memory cell type, wherein the memory cells of the first memory cell type are capable of storing data corresponding to data present at a data input terminal, and the memory cells of the second memory cell type are capable of storing data inverted with respect to the data present at the data input terminal, wherein a portion of the memory cells are the redundant memory cells, wherein the memory cells are selectable by address bits of an address and are connected to bit lines of a bit line twist, wherein the bit lines are offset with respect to one another in sections of the bit line twist;

first word lines and second word lines arranged within the memory cell array in a first strip and a second strip, the first strip and the second strip being disposed on different sides of the bit line twist respectively, wherein the memory cells are drivable via the first and second word lines, and wherein a defective memory cell of either of the first and second memory cell types is replaceable by a redundant memory cell of either of the first and second memory cell types;

a data inversion circuit configured to read and write data to the memory cells, wherein: the data inversion circuit writes to the redundant memory cell data corresponding to the data present at the data input terminal if the redundant memory cell and the defective memory cell are the same memory cell type; the data inversion circuit writes to the redundant memory cell data inverted with respect to the data present at the data input terminal if the defective memory cell is drivable via one of the first word lines and the redundant memory cell is drivable via one of the second word lines, and if the defective memory cell and the redundant memory cell are different memory cell types; and the data inversion circuit reads from the redundant memory cell data inverted with respect to the data present at the data input terminal if the defective memory cell is drivable via one of the first word lines and the redundant memory cell is drivable via one of the second word lines, and if the defective memory cell and the redundant memory cell are different memory cell types; and a first control unit configured to determine whether the defective and the redundant memory cells are drivable via one of the first and second word lines by comparing respective address bits of the address of the redundant and the defective memory cells.

2. The integrated semiconductor memory as claimed in claim 1, further comprising:

a first control unit comprising a first output terminal operable to generate a first control signal, a first input terminal operable to apply an address of one of the memory cells of the memory cell array, and a second input terminal operable to apply an address of the defective memory cell; and a second control unit operable to generate a control signal for data inversion, including a first input terminal operable to apply the first control signal, wherein:

the data inversion circuit comprises a control terminal;

the second control unit is coupled, on an input side, to the first output terminal of the first control unit and, on an output side, to the control terminal of the data inversion circuit;

the control signal for data inversion is fed to the control terminal of the data inversion circuit;

the first control unit is operable to generate the first control signal if an applied address of one of the memory cells matches the address of the defective memory cell and the defective memory cell is drivable via one of the first word lines and the redundant memory cell replacing the defective memory cell is drivable via one of the second word lines;

the second control unit is operable to generate the control signal for data inversion, if the first control signal is fed to the second control unit on the input side and the defective memory cell and the redundant memory cell replacing the defective memory cell are different memory cell types;

in the event of a write access, the data inversion circuit writes to the redundant memory cell data inverted with respect to the data present at the data input terminal, if the control signal for data inversion is fed to the data inversion circuit on the input side; and in the event of a read access, the data inversion circuit reads out data inverted with respect to the data previously written to the redundant memory cell if the control signal for data inversion is fed to the data inversion circuit on the input side.

3. The integrated semiconductor memory as claimed in claim 2, further comprising:

an address register including a plurality of address terminals; and a memory unit operable to store an address of the defective memory cell that is replaced by the redundant memory cell, wherein the first input terminal of the first control unit is coupled to the address register, and wherein the second input terminal of the first control unit is coupled to the memory unit.

4. The integrated semiconductor memory as claimed in claim 3, wherein:
the address of one of the memory cells comprises a first address bit and a second address bit;
a first logic level is generated by a logic combination of the first and second address bits if the memory cell is drivable via one of the first word lines; and
a second logic level is generated by a logic combination of the first and second address bits if the memory cell is drivable via one of the second word lines.

5. The integrated semiconductor memory as claimed in claim 4, wherein the logic combination of the first and second address bits comprises an XOR combination.

6. The integrated semiconductor memory as claimed claim 4, wherein:
the first control unit comprises a comparison circuit operable to generate a second control signal, a logic gate operable to generate the first control signal, and a logic circuit operable to generate a third control signal;
the address of the defective memory cell and the address applied to the address terminals of the address register are fed to the comparison circuit on the input side;
the comparison circuit generates the second control signal on the second output terminal of the first control unit;
the first and second address bits of the defective memory cell are fed to the logic circuit;
the second control signal and the third control signal are fed to the logic gate on the input side; and
the logic gate generates the first control signal on the first output terminal of the first control unit.

7. The integrated semiconductor memory as claimed in claim 6, wherein:
the comparison circuit is configured to generate the second control signal if the address of one of the memory cells that is applied to the address terminals of the address register matches the address of the defective memory cell; and
the logic circuit is configured to generate the third control signal if the defective memory cell is drivable via one of the first word lines and the redundant memory cell replacing the defective memory cell is drivable via one of the second word lines.

8. The integrated semiconductor memory as claimed in claim 7, wherein the logic gate of the first control unit comprises an AND gate.

9. The integrated semiconductor memory as claimed in claim 7, wherein:
the memory unit is configured to store the address of the redundant memory cell that replaces the defective memory cell and to enable assignment of the address of the defective memory cell to the address of the redundant memory cell that replaces the defective memory cell.

10. The integrated semiconductor memory as claimed in claim 9, wherein the memory unit for storing the address of the defective memory cell comprises a look-up table for assigning the address of the defective memory cell to the address of the redundant memory cell.

11. The integrated semiconductor memory as claimed in claim 9, wherein:
the logic circuit of the first control unit is coupled, on the input side, to the second input terminal of the first control unit;
the logic circuit of the first control unit comprises a first logic gate and a second logic gate each including an output terminal;
the logic circuit of the first control unit comprises an evaluation circuit coupled, on the input side, to the output terminals of the first and second logic gates;
the first and second address bits of the defective memory cell are fed to the first logic gate on the input side;
the first and second address bits of the redundant memory cell are fed to the second logic gate of the logic circuit on the input side;
the first and second logic gates of the logic circuit are configured such that the first logic gate generates a first logic level on the output side if the first and second address bits of the defective memory cell that are fed to the first logic gate on the input side address a memory cell drivable via one of the first word lines, and the second logic gate generates a first logic level on the output side if the first and second address bits of the redundant memory cell that are fed to the second logic gate on the input side address a memory cell drivable via one of the first word lines;
the first and second logic gates of the logic circuit are configured such that the first logic gate generates a second logic level on the output side if the first and second address bits of the defective memory cell that are fed to the first logic gate on the input side address a memory cell drivable via one of the second word lines and the second logic gate generates a second logic level on the output side if the first and second address bits of the redundant memory cell that are fed to the second logic gate on the input side address a memory cell drivable via one of the second word lines; and
the evaluation circuit of the logic circuit is configured to generate the third control signal on the output side if the logic levels of the first and second logic gates of the logic circuit that are fed to the evaluation circuit on the input side do not match.

12. The integrated semiconductor memory as claimed in claim 11, wherein the first and second logic gates of the logic circuit comprise an XOR gate.

13. The integrated semiconductor memory as claimed in claim 7, wherein:
the redundant memory cell is drivable via one of the second word lines; and
the memory unit comprises a first partial memory for storing the address of the defective memory cell, the defective memory cell being replaceable by the redundant memory cell.

14. The integrated semiconductor memory as claimed in claim 13, wherein:
the logic circuit of the first control unit is coupled to the second input terminal of the first control unit;
the logic circuit comprises a logic gate;
the first and second address bits of the address of the defective memory cell that is stored in the first partial memory is fed to the logic gate; and
the logic gate of the logic circuit is configured to generate the third control signal on the output side if the first and second address bits of the defective memory cell that are fed to the logic gate on the input side address a memory cell drivable via one of the first word lines.

15. The integrated semiconductor memory as claimed in claim 14, wherein the logic gate of the logic circuit comprises an XOR gate.

16. The integrated semiconductor memory as claimed in claim 7, wherein:
the redundant memory cell is drivable via one of the first word lines; and the memory unit comprises a second partial memory for storing the address of the defective memory cell, the defective memory cell being replaceable by the redundant memory cell.

17. The integrated semiconductor memory as claimed in claim 16, wherein:
the logic circuit of the first control unit is connectable to the second input terminal of the first control unit;
the logic circuit comprises a logic gate;
the first and second address bits of the address of the defective memory cell that is stored in the second partial memory is fed to the logic gate; and
the logic gate of the logic circuit generates the third control signal if the first and second address bits of the defective memory cell that are fed to the logic gate on the input side address a memory cell drivable via one of the second word lines.

18. The integrated semiconductor memory as claimed in claim 17, wherein the logic gate of the logic circuit comprises an XNOR gate.

19. The integrated semiconductor memory as claimed in claim 3, further comprising:
first sense amplifiers and second sense amplifiers, the first sense amplifiers being arranged within the memory cell array in a first strip and the second sense amplifiers being arranged within the memory cell array in a second strip, wherein:
the address of the defective memory cell and the address of a memory cell applied to the address terminals of the address register are fed to the second control unit on the input side;
the second control unit comprises a first partial memory for storing the address of a first defective memory cell, the first defective memory cell being drivable via one of the first sense amplifiers;
the second control unit comprises a second partial memory for storing the address of a second defective memory cell, the second defective memory cell being drivable via one of the second sense amplifiers;
the second control unit comprises a comparison circuit for generating the control signal for data inversion;
the addresses of the defective memory cells from the memory unit are fed to the first and second partial memories; and
the comparison circuit is configured to generate the control signal for data inversion if the first control signal is fed to the comparison circuit on the input side and the address of a memory cell that is fed to the comparison circuit via the address register matches the address of the defective memory cell that is stored in the second partial memory.

20. The integrated semiconductor memory as claimed in claim 19, wherein:
the data inversion circuit comprises a controllable switch that is controllable by the control signal for data inversion, and a bidirectional inverter;
the controllable switch feeds the data fed to the controllable switch from the data input terminal to the data terminal of the memory cell array via the bidirectional inverter, when the signal for data inversion is driven with a first logic level; and
the controllable switch feeds the data fed to the controllable switch from the data input terminal to the data terminal of the memory cell array, when the signal for data inversion is driven with a second logic level.

21. The integrated semiconductor memory as claimed in claim 20, wherein:
the first sense amplifiers are coupled to a first secondary sense amplifier;
the second sense amplifiers are coupled to a second secondary sense amplifier; and
the data fed at the data terminal of the memory cell array via the bidirectional inverter of the circuit for data inversion is fed to the second secondary sense amplifier via a switching device.

22. The integrated semiconductor memory as claimed in claim 19, wherein:
the data inversion circuit comprises a first controllable switch including a control terminal for applying the control signal for data inversion and a second controllable switch including a control terminal for applying the control signal for data inversion;
the memory cell array comprises a first bit line and a first inverse bit line, the first inverse bit line being at an inverse charge level with respect to the first bit line;
the memory cell array comprises a second bit line and a second inverse bit, the second inverse bit line being at an inverse charge level with respect to the second bit line;
the second bit line and the second inverse bit line are coupled to the input side of the second sense amplifiers; and
in the event of the control signal for data inversion being driven with a first logic level, the data inversion circuit is configured such that the first bit line is coupled to the second inverse bit line via the first controllable switch, and the first inverse bit line is coupled to the second bit line via the second controllable switch.

23. The integrated semiconductor memory as claimed in claim 22, wherein:
the data inversion circuit includes a control terminal for applying a control signal to activate the second bit line and the second inverse bit line, a logic AND gate operable to generate an activation signal, a third controllable switch including a control terminal for applying the activation signal, and a fourth controllable switch including a control terminal for applying the activation signal;
the control signal for data inversion is negated, and the control signal for activating the second bit line and the second inverse bit line are fed to the AND gate on the input side; and
in the event of the signal for data inversion being driven with a second logic level and application of the control signal for activating the second bit line and the second inverse bit line, the data inversion circuit is configured such that the first bit line is coupled to the second bit line via the third controllable switch and the first inverse bit line is coupled to the second inverse bit line via the fourth controllable switch.

24. The integrated semiconductor memory as claimed in claim 4, wherein the first logic level is a logic high state and the second logic level is a logic low state.

25. The integrated semiconductor memory as claimed in claim 19, wherein a plurality of bit lines coupled to the first sense amplifiers and second sense amplifiers are arranged as a bit line twist.

26. A method for testing the integrated semiconductor memory of claim 2, comprising:
generating the first control signal by the first control unit, if an address applied to address terminals of the integrated semiconductor memory addresses the defective memory cell and the defective memory cell is drivable via one of the first word lines and the redundant memory cell replacing the defective memory cell is drivable via one of the second word lines;

writing data inverted with respect to data present at the data input terminal to the redundant memory cell by the data inversion circuit if the first control unit generates the first control signal, and the defective memory cell and the redundant memory cell replacing the defective memory cell are different memory cell types; and reading-out data inverted with respect to the data previously written in inverted fashion to the redundant memory cell by the data inversion circuit if the first control unit generates the first control signal, and the defective memory cell and the redundant memory cell replacing the defective memory cell are different memory cell types.

27. The method for testing an integrated semiconductor memory as claimed in claim 26, comprising:

generating the control signal for data inversion by the second control unit if the first control unit generates the first control signal, and the defective memory cell and the redundant memory cell replacing the defective memory cell are different memory cell types;

writing data inverted with respect to the data present at the data input terminal to the redundant memory cell by the data inversion circuit, if the second control unit generates the control signal for data inversion; and reading-out the data inverted with respect to the data previously written in inverted fashion in the redundant memory cell by the data inversion circuit if the second control unit generates the control signal for data inversion.

28. The method for testing an integrated semiconductor memory as claimed in claim 27, further comprising:

storing an address of the defective memory cell in a memory unit.

29. The method for testing an integrated semiconductor memory as claimed in claim 28, further comprising:

storing the address of the redundant memory cell replacing the defective memory cell in the memory unit;

comparing an address applied to the address terminals with the address of the defective memory cell that is stored in the memory unit by a comparison circuit;

generating a second control signal by the first control unit if the address applied to the address terminals matches the address of the defective memory cell;

evaluating the first and second address bits of the defective memory cell and of the redundant memory cell replacing the defective memory cell via a logic combination of the first and second address bits;

generating a third control signal if the defective memory cell is drivable by one of the first word lines and the redundant memory cell replacing the defective memory cell is drivable by one of the second word lines; and generating the first control signal by the first control unit, if the comparison circuit generates the second control signal and a logic circuit generates the third control signal.

30. The method for testing an integrated semiconductor memory as claimed in claim 28, comprising:

storing the address of the defective memory cell in a first partial memory of the memory unit if the redundant memory cell replacing the defective memory cell is drivable via one of the second word lines;

comparing an address applied to the address terminals with the address of the defective memory cell that is stored in the first partial memory of the memory unit by a comparison circuit;

generating the second control signal by the first control unit if the address applied to the address terminals matches the address of the defective memory cell;

evaluating the first and second address bits of the defective memory cell by a logic combination of the first and second address bits, via a logic circuit of the first control unit;

generating the third control signal by a logic gate of the logic circuit if the defective memory cell is driven by one of the first word lines; and generating the first control signal by the first control unit if the comparison circuit generates the second control signal and the logic circuit generates the third control signal.

31. The method for testing an integrated semiconductor memory as claimed in claim 28, comprising:

storing the address of the defective memory cell in a second partial memory of the memory unit if the redundant memory cell replacing the defective memory cell is drivable via one of the first word lines;

comparing the address applied to the address terminals with the address of the defective memory cell that is stored in the second partial memory of the memory unit by a comparison circuit;

generating the second control signal by the first control unit if the address applied to the address terminals matches the address of the defective memory cell;

evaluating the first and second address bits of the defective memory cell by employing a logic combination of the first and second address bits via a logic circuit of the first control unit;

generating the third control signal by a logic gate of the logic circuit if the defective memory cell is driven by one of the second word lines; and generating the first control signal by the first control unit if the comparison circuit generates the second control signal and the logic circuit generates the third control signal.

32. The method for testing an integrated semiconductor memory as claimed in claim 31, comprising:

storing the address of the defective memory cell in a first partial memory of a second control unit if the defective memory cell is drivable via one of plurality of first sense amplifiers;

storing the address of the defective memory cell in a second partial memory of the second control unit if the defective memory cell is drivable via one of plurality of second sense amplifiers; and generating the control signal for data inversion by the data inversion circuit if the first control unit generates the first control signal and the address applied to the address terminals of the address register matches the address of the defective memory cell that is stored in the second partial memory of the second control unit.

33. A method for operating the integrated semiconductor memory as claimed in claim 2, comprising:

generating the first control signal by the first control unit if the address applied to address terminals of the integrated semiconductor memory addresses the defective memory cell and the defective memory cell is drivable via one of the first word lines and the redundant memory cell replacing the defective memory cell is drivable via one of the second word lines;

writing data inverted with respect to the data present at the data input terminal to the redundant memory cell by the data inversion circuit if the first control unit generates the first control signal and the defective memory cell and the redundant memory cell replacing the defective memory cell are different memory cell types; and reading-out data inverted with respect to the data previously written in inverted fashion to the redundant memory cell by the data inversion circuit if the first control unit generates the first control signal and the defective memory cell and the redundant memory cell replacing the defective memory cell are different memory cell types.

34. The method for operating an integrated semiconductor memory as claimed in claim 33, further comprising:
generating the control signal for data inversion by the second control unit if the first control unit generates the first control signal and the defective memory cell and the redundant memory cell replacing the defective memory cell are different memory cell types;
writing data inverted with respect to the data present at the data input terminal to the redundant memory cell by the data inversion circuit if the second control unit generates the control signal for data inversion; and
reading-out data inverted with respect to the data previously written in inverted fashion in the redundant memory cell, by the data inversion circuit, if the second control unit generates the control signal for data inversion.

35. The method for operating an integrated semiconductor memory as claimed in claim 34, further comprising:
storing the address of the defective memory cell in a memory unit.

36. The method for operating an integrated semiconductor memory as claimed in claim 35, further comprising:
storing the address of the redundant memory cell replacing the defective memory cell in the memory unit;
comparing the address applied to the address terminals with the address of the defective memory cell that is stored in the memory unit by the comparison circuit;
generating the second control signal via the first control unit if the address applied to the address terminals matches the address of the defective memory cell;
evaluating the first and second address bits of the defective memory cell and of the redundant memory cell, and replacing the defective memory cell with a logic combination of the first and second address bits;
generating the third control signal via the logic circuit if the defective memory cell is driven by one of the first word lines and the redundant memory cell replacing the defective memory cell is drivable by one of the second word lines; and
generating the first control signal via the first control unit if the comparison circuit generates the second control signal and the logic circuit generates the third control signal.

37. The method for operating an integrated semiconductor memory as claimed in claim 35, comprising:
storing the address of the defective memory cell in a first partial memory of a memory unit if the redundant memory cell replacing the defective memory cell is drivable via one of the second word lines;
comparing the address applied to the address terminals with the address bit of the defective memory cell that is stored in the first partial memory of the memory unit by a comparison circuit;
generating the second control signal via the first control unit if the address applied to the address terminals matches the address of the defective memory cell;
evaluating the first and second address bits of the defective memory cell with the logic combination of the first and second address bits by a logic circuit of the first control unit;
generating the third control signal by the logic gate of the logic circuit if the defective memory cell is driven by one of the first word lines; and
generating the first control signal via the first control unit if the comparison circuit generates the second control signal and the logic circuit generates the third control signal.

38. The method for operating an integrated semiconductor memory as claimed in claim 35, comprising:
storing the address of the defective memory cell in a second partial memory of a memory unit if the redundant memory cell replacing the defective memory cell is drivable via one of the first word lines;
comparing an address applied to the address terminals with the address of the defective memory cell that is stored in the second partial memory of the memory unit;
generating the second control signal by the first control unit if the address applied to the address terminals matches the address of the defective memory cell;
evaluating the first and second address bits of the defective memory cell with a logic combination of the first and second address bits via the logic circuit of the first control unit;
generating the third control signal with the logic gate of the logic circuit if the defective memory cell is driven by one of the second word lines; and
generating the first control signal with the first control unit if the comparison circuit generates the second control signal and the logic circuit generates the third control signal.

39. The method for operating an integrated semiconductor memory as claimed in claim 36, comprising:
storing the address of the defective memory cell in a first partial memory of the second control unit if the defective memory cell is drivable via one of a plurality of first sense amplifiers;
storing the address of the defective memory cell in a second partial memory of the second control unit if the defective memory cell is drivable via one of a plurality of second sense amplifiers; and
generating the control signal for data inversion by the data inversion circuit if the first control unit generates the first control signal and the address applied to the address terminals of the address register matches the address of the defective memory cell that is stored in the second partial memory of the second control unit.

40. The integrated semiconductor memory as claimed in claim 3, wherein:
the address of one of the memory cells comprises a first address bit and a second address bit;
a first logic level is generated by a logic combination of the first and second address bits if the memory cell is drivable via one of the first word lines; and
a second logic level is generated by a logic combination of the first and second address bits if the memory cell is drivable via one of the second word lines;
the integrated semiconductor memory further comprising:
first sense amplifiers and second sense amplifiers, the first sense amplifiers being arraged within the memory cell array in a first strip and the second sense amplifiers being arranged within the memory cell array in a second strip; wherein:

the address of the defective memory cell and the address of a memory cell applied to the address terminals of the address register are fed to the second control unit on the input side;

the second control unit comprises a first partial memory for storing the address of a first defective memory cell, the first defective memory cell being drivable via one of the first sense amplifiers;

the second control unit comprises a second partial memory for storing the address of a second defective memory cell, the second defective memory cell being drivable via one of the second sense amplifiers;

the second control unit comprises a comparison circuit for generating the control signal for data inversion;

the address of the defective memory cells from the memory unit are fed to the first and second partial memories; and the comparison circuit is configured to generate the control signal for data inversion if the first control signal is fed to the comparison circuit on the input side and the address of a memory cell that is fed to the comparison circuit via the address register matched the address of the defective memory cell that is stored in the second partial memory.

* * * * *

UNITED STATES PATENT AND TRADEMARK OFFICE
CERTIFICATE OF CORRECTION

PATENT NO. : 7,236,412 B2
APPLICATION NO. : 11/053659
DATED : June 26, 2007
INVENTOR(S) : Proll et al.

It is certified that error appears in the above-identified patent and that said Letters Patent is hereby corrected as shown below:

Col. 13, l. 60: "unit 50, and an terminal" should read

--unit 50, and an input side of the decoder circuit 40. The address register 70 is connected to a first input terminal--

Col. 17, l. 46: "SAA2" should read --SSA2--

Col. 18, l. 45: "X10 = 1" should read --X10 = 0--

Col. 32, l. 67: "arraged" should read --arranged--

Col. 34, l. 3: "address" should read --addresses--

Col. 34, l. 11: "matched" should read --matches--

Signed and Sealed this

Eighth Day of April, 2008

JON W. DUDAS
*Director of the United States Patent and Trademark Office*